United States Patent [19]

Hertler

[11] 3,871,885

[45] Mar. 18, 1975

[54] CRYSTALLINE PHOTO-POLYMERIZABLE COMPOSITION

[75] Inventor: Walter Raymond Hertler, Kennett Square, Pa.

[73] Assignee: E. I. du Pont de Nemours and Company, Wilmington, Del.

[22] Filed: Oct. 20, 1972

[21] Appl. No.: 299,471

Related U.S. Application Data

[63] Continuation-in-part of Ser. No. 144,629, May 18, 1971, abandoned, which is a continuation of Ser. No. 53,537, June 9, 1970, abandoned.

[52] U.S. Cl. ........... 96/35.1, 96/115 P, 204/159.23, 96/67

[51] Int. Cl. ........................... G03c 1/68, G03c 1/70

[58] Field of Search ......... 96/115 P, 115 M, 90, 86, 96/33, 35.1; 204/159.23; 260/28.5 AV, 878

[56] References Cited

UNITED STATES PATENTS

| | | | |
|---|---|---|---|
| 3,042,519 | 7/1962 | Wainer | 96/90 R |
| 3,203,805 | 8/1965 | Burg | 96/115 P |
| 3,297,440 | 1/1967 | Delzenne | 96/35.1 |
| 3,674,494 | 7/1972 | Hoffmann | 96/115 P |
| 3,689,565 | 9/1972 | Hoffmann | 96/115 P |

*Primary Examiner*—Norman G. Torchin
*Assistant Examiner*—John L. Goodrow

[57] ABSTRACT

Predominantly crystalline photopolymerizable compositions contain a nongaseous ethylenic monomer and an organic, light sensitive, free-radical generating system which acts as a polymerization initiator for the monomer. Depending on their composition the crystalline compositions are polymerizable either in air or in the absence of air, upon exposure to relatively small amounts of light, e.g., on the order of 6 to 2000 $\mu$j/sq.cm. They are useful for photoimaging, preparation of films and fibers, transparent projection slides, lightographic plates, photoresists and photoactive cements, etc.

79 Claims, 6 Drawing Figures

INVENTOR.
WALTER R. HERTLER
BY Anthony P. Mentis
ATTORNEY

INVENTOR
WALTER R. HERTLER

BY Anthony P. Mentis
ATTORNEY

INVENTOR
WALTER R. HERTLER
BY Anthony P. Mentis
ATTORNEY

INVENTOR
WALTER R. HERTLER
BY Anthony P. Mentis
ATTORNEY

PATENTED MAR 18 1975

3,871,885

SHEET 5 OF 6

INVENTOR
WALTER R. HERTLER

BY *Anthony P. Mentis*

ATTORNEY

PATENTED MAR 18 1975 3,871,885

INVENTOR
WALTER R. HERTLER

BY Anthony P. Mentis
ATTORNEY

CRYSTALLINE PHOTO-POLYMERIZABLE COMPOSITION

CROSS REFERENCE TO RELATED APPLICATION

This application is a continuation-in-part of my copending application Ser. No. 144,629, filed May 18, 1971, now abandoned which in turn is a continuation-in-part of my application Ser. No. 53,537, filed June 9, 1970, now abandoned.

BACKGROUND OF THE INVENTION

Field of the Invention

This invention relates to photopolymerizable compositions which are predominantly crystalline in nature, and in which any or any mixture of monomer, initiator and an inert substance can comprise the crystalline matrix. These crystal matrices define noncrystalline or disordered regions containing molecules of a nongaseous, polymerizable ethylenically unsaturated compound and an organic, light-sensitive free radical generating system in their noncrystalline state.

Description of the Prior Art

U.S. Pat. No. 2,760,863 issued Aug. 28, 1956 to L. Plambeck discloses viscous, slow-flowing photographic compositions for making relief images comprising a polymerizable ethylenically unsaturated monomer, a polymerization initiator, and an organic polymer, which latter acts as a binder to keep the first two components in an easily handled composition. The unsaturated compound and the initiator are dispersed throughout the binder composition and are in the liquid or colloidal phase. Such compositions are inhibited by molecular oxygen in the photopolymerization reaction as evidenced for example by U.S. Pat. Nos. 3,144,331; 3,196,098; and 3,203,805, among others.

The binder systems of the art, despite their wide use, have many disadvantages such as oxygen-sensitivity, slow removal of the solvent used in casting, slow dissolution in wash-out development and requirement for protective cover sheets. For example, it has been necessary in the past to expose such photopolymerizable compositions to a relatively high intensity source of actinic radiation to use up the oxygen in them; to "presoak" the photosensitive compositions in an inert atmosphere to displace the contained oxygen; to preexpose the compositions to a fogging light to use up the oxygen in the bulk of the sample; to protect the surface of such compositions with an oxygen-impervious layer such as a glass cover sheet or a film of polyethylene terephthalate or a layer of wax; or to expose the compositions to light in an inert oxygen-free atmosphere or in a vacuum frame. All of these methods are time consuming, increase the complexity of photographic plate preparation and increase costs.

In addition to the above, the compositions of the prior art have relatively low speeds, i.e. the rate of photopolymerization is quite low and necessitates fairly long exposure times to intense light sources.

Polymerization of crystalline unsaturated compounds has only recently been studied to any great extent. Studies, for example by Bamford et al. in Nature 186, 713, 714 (1960), Journal of Polymer Science 48, 37–51 (1960), and in Proc. Roy. Soc. 271, 357–378 (1963), have done much to explain the mechanism of ultraviolet-induced polymerization of several unsaturated monomers in the crystalline state but the authors have not shown generally applicability or disclosed any system that is practically useful and promotes the progress of the useful arts. U.S. Pat. No. 3,244,519 issued to Schwerin on Apr. 5, 1966 discloses a photopolymerizable composition containing a binder and a low molecular weight crystalloidal material. The latter substance is stated to improve the transfer of an image to a transfer sheet. U.S. Pat. No. 3,297,440 to Delzenne dated Jan. 10, 1967 discloses photopolymerizable compositions containing ethylenic monomers and a special class of polymerization initiators comprising amine complexes with cobalt metal. Such initiators are not organic initiators because they depend on the presence of the metal. The statement is made that when the photopolymerizable compounds are in the crystalline state more effective photopolymerization occurs but no examples are given of such compositions or their preparation. The speed of the disclosed compositions appears to be quite slow as indicated by exposure to 80 watt mercury vapor lamp for periods ranging from 2 minutes up to 60 minutes. Canadian Pat. No. 806,702 issued Feb. 18, 1969 shows photopolymerizable compositions comprising a crystalline polyacetylenic compound. British Pat. No. 1,161,624 published Aug. 13, 1969 shows crystalline polymerizable compositions comprising polyacetylenic compounds and radiation sensitizers which are $\pi$-acid electron acceptors. These latter compounds are not photoinitiators for vinyl monomers. Krauch et al, Naturwiss. 55, 539 (1968) and Chem. and Eng. News 38, 39 (1969), report an interesting development concerning a process of converting monomer directly to nonwoven fabric. A solution of a monomer and catalyst in a freezable solvent is cast on a cold substrate to freeze tiny crystals of the solvent into a matrix. As the matrix forms, the monomer is forced to spread homogeneously throughout the resulting crystalline network. The monomer is polymerized as by exposure to light and the crystalline matrix is then melted to leave behind a porous non-woven fabric of polymerized material.

Other art which may be considered of interest includes U.S. Pat. No. 3,042,519 issued to Wainer on July 3, 1962. It shows photopolymerizable compositions containing an N-vinyl unsaturated monomer, a halogenated organic compound which acts as a source of free radicals, and a paraffinic hydrocarbon such as microcrystalline wax. Synthetic resins are stated to be advantageously used. U.S. Pat. No. 3,489,562 issued to Krauch et al on Jan. 13, 1970 discloses light sensitive compositions of ethylenic monomers and polymerization initiators which contain aliphatic halogen. It is stated to be advantageous to include resins to effect better adhesion of the light sensitive layer to the support and that the resins prevent partial crystallization of the layer and render it more easily developable. German Auslegeschrift 1,298,414 published June 26, 1969 shows initiators containing aliphatic halogen and resinous binders are indicated as being useful. British Pat. No. 1,149,259 published Apr. 23, 1969 shows vinyl monomers, dyes, and halogenated hydrocarbons. The compositions of the last two references are not very stable thermally and have very short shelf lives on the order of a few hours. None of the four publications immediately above disclose or teach the benefits of crystalline compositions.

DESCRIPTION OF THE INVENTION

It has now been found that predominantly crystalline systems, in which any of monomer, initiator, and an inert substance or any mixture thereof comprise the crystalline phase, provide novel and practical polymerization systems that have significant advantages over the previously known systems. These predominantly crystalline compositions are generally photopolymerizable in air without retardation or inhibition and all systems in which the monomer is solid photopolymerize in air with no more than nominal retardation. The predominantly crystalline compositions, the monomer content of which is mostly liquid, vary widely in their sensitivity to air in that some are sensitive and some are not. In those compositions which are sensitive to air, the crystalline component, initiator system and/or an inert solid substance, appears to so facilitate removal of whatever inhibitors are present, presumably oxygen, as to result in a composition that yields a photoimage on irradiation and development with as little as 6 μj/sq.cm. All systems of this invention polymerize on receiving radiation totalling 2000 μj/sq.cm. or less and the preferred compositions photopolymerize on an irradiation with not more than 1000 μj/sq.cm.

The compositions of the invention thus have high photospeeds when exposed to only small quantities of light. They also have good resolution abilities, good storage life, and are developed by simple procedures including a unique process whereby development is accomplished by merely heating the preparation to volatilize unpolymerized monomer. Some of the compositions can be used as the sole photoimaging composition in a camera for taking pictures.

Photoactive materials possessing these characteristics according to the invention are predominantly crystalline photopolymerizable compositions comprising crystals which define amorphous or disordered regions, that is, regions which are not crystalline, which regions contain molecules of a nongaseous, polymerizable unsaturated compound and molecules of an organic, light-sensitive, free-radical generating system in a noncrystalline state.

The predominantly crystalline systems that contain solid monomers are particularly useful in that they are polymerizable in air and thereby avoid one of the most common difficulties of the prior art.

More specifically, one aspect of the invention comprises a substantially dry, predominantly crystalline photopolymerizable composition in the form of a thin layer ranging from about 1 micron to about 1 millimeter in thickness, having substantially homogeneously distributed there-through closely arrayed crystals comprising at least one solid, ethylenically unsaturated monomer melting in the range 25° to 100°C. and capable of forming a polymer having a degree of polymerization of at least 10 by free-radical initiated, chain propagating, addition polymerization, and for each part by weight of monomer, 0.001 to 1 part by weight of an organic, light-sensitive, free-radical generating system free of aliphatic halogen which initiates, and subsequently does not terminate the polymerization, at least one component of which has an active light absorption band with a molar extinction coefficient of 100 or more measured in hexane in the range of 3300 to 8000 A, said composition having a crystallinity index of at least 0.2 and being photopolymerizable in atmospheric oxygen and capable of yielding a photoimage on receiving light totalling 2000 μj/sq. cm. or less, said light being active to cause said free-radical generating system to generate free radicals.

The compositions are wholly crystalline in their external aspects and are capable of rapid polymerization on exposure to relatively small amounts of light. By "substantially dry" it is meant that the compositions contain no resins or binders, and no liquid in the way that prior art compositions do, and for all practical purposes are dry to the touch. The molecules present in the interfacial regions are not necessarily in their crystalline state but have a certain mobility and from this point of view the compositions may be considered to contain liquid or liquid-like regions.

The crystals may be comprised of the monomer or of both monomer and free-radical generator. The free-radical generating system may be referred to hereafter as polymerization initiator or simply as initiator. It should be understood that in each case the disordered regions at the crystal interfaces contain molecules of both monomer and organic initiator in their noncrystalline state since it is believed the photoinitiated polymerization of the unsaturated compound occurs primarily in such disordered regions between the crystal faces.

Disordered regions which are in intimate contact with the faces of closely arrayed crystals are formed when materials are crystallized, for example, from melts or solutions. The invention requires the presence of large numbers of small crystals with accompanying large amounts of adjacent disordered regions. The regions defined by the crystal faces are designated as amorphous or disordered regions because the molecules of material present there are not crystalline and it is thought such molecules have more mobility than the molecules forming the lattice or rigid framework of the crystals. Support for this viewpoint is found in the recent article of Karagounis et al., Nature 221, 655, Feb. 1969 where it is reported that melting points of molecular layers spread over solid surfaces are lower than the melting points of the bulk substances. Such layers cannot be considered to be in a solid state and may therefore be thought of as being liquid or liquid-like.

It is advantageous that the crystals be sufficiently small in size, and the disordered regions be present in sufficient manner to give a fine network having a relatively large area, so that satisfactorily sharp images are obtained. The thin layers should be as homogeneous as possible, that is, more uniform and smooth the crystalline layer looks to the eye, the more uniform will be the resulting polymer. Rapid crystallization is an aid in producing smooth homogeneous layers. All crystals have three dimensions and the invention contemplates the use of crystals having a variety of shapes and sizes. The crystals generally are no smaller than about 2 millimicrons in their shortest dimension and no larger than about 1 millimeter in their largest dimension. It is preferred to use crystals which have one dimension smaller than the other two and which have an average size ranging from about one-fortieth to one-fifth millimeter.

The figures illustrate certain features discussed in the specification.

Organic compositions may contain simultaneously crystalline and noncrystalline regions. By crystalline is meant a solid in which the molecules are arranged in an orderly three dimensional array for which a unit cell can be defined and which will yield discrete Bragg reflections when examined by the powder method of X-ray diffraction. For further information reference may be made to H. P. Klug and L. E. Alexander, "X-Ray Diffraction Procedures," Wiley, N. Y. (1954), pp. 626–630.

Liquids and amorphous solids possessing one or two dimensional order, as in liquid crystals and glasses, are not considered to be crystalline.

The crystallinity index of the compositions of the invention should be at least 0.2, the upper limit ranging to infinity. The index is computed from X-ray diffraction powder method data in the form of a scintillation counter intensity versus $2\theta$ graph obtained from a diffractometer where $\theta$ is the Bragg angle. The basic idea is that of comparing the diffracted energy of the Bragg reflections (above the line I) to that of the noncrystalline scattering (below the line I). A typical diffractometer graph is shown in schematic FIG. 1.

The discrete Bragg reflections such as A, B and C etc. are superimposed on a broad background line I. The Bragg reflections are those peaks which have a width at half-height less than 1° in $\theta$, thus excluding the very broad peaks which may be due to one or two dimensional order. The crystallinity index is defined as the area B under all of the Bragg reflections, but above the line I, divided by the area A under the line I, or $$X_c = B/A$$

Figure 1:
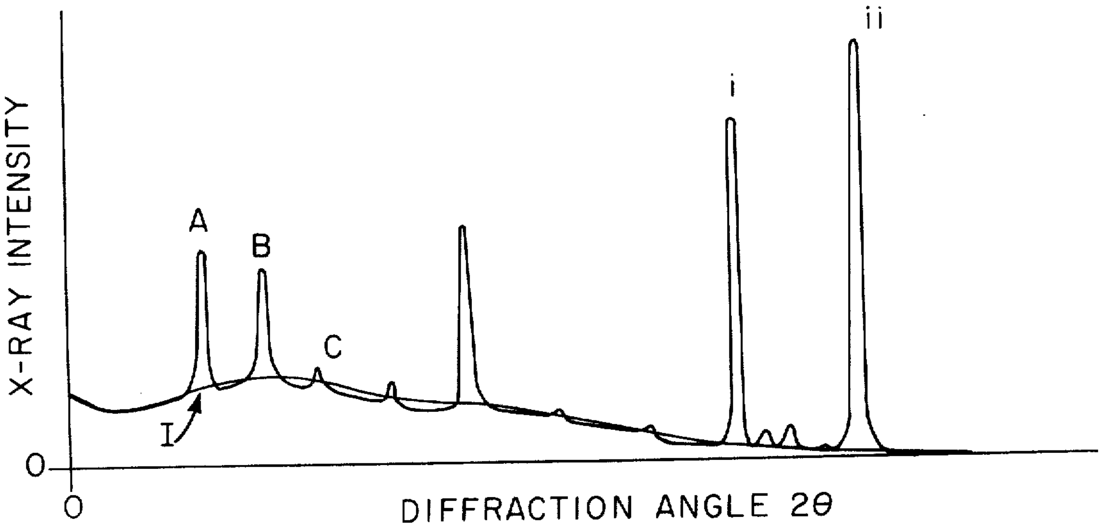
FIG. 1 is a schematic representation of a diffractometer graph for calculating the crystallinity index of the compositions of the invention.

Bragg reflections due to the aluminum substrate, such as i and ii in FIG. 1, are not to be considered in computing $X_c$. In computing these areas, the background radiation is to be excluded from consideration. For example the base line of the recorder can be adjusted so that it reads zero intensity with the X-ray source turned off.

To make the above calculation for $X_c$, the experimental setup must be as follows:

X-ray Diffractometer - Norelco Model No. 2
Sample thickness - 10–1000 μm
Substrate - aluminum plate
  Diffraction conditions:
  Tube voltage - 40 KV
  Tube current - 35 ma
Time constant - 2 seconds or less Radiation - Cu $K_\alpha$
Traverse speed - 2°/minute
Monochromator - LiF curved crystal
Detector - Scintillation Counter, PHA, Hamner.

An example of determining the crystallinity index follows. The graph produced by the machine has the line I inscribed on it preferably by a person skilled in X-ray diffraction measurements. The line I defines the noncrystalline scattering on the X-ray intensity versus $2\theta$ plot. The area under I and between the verticals drawn at some point removed from zero, say $2\theta = 10°$, and also at $2\theta = 60°$, is determined with a planimeter. This is area A. Next the discrete X-ray diffractions extending above I are selected, those due to the aluminum substrate being ignored, and the area under each peak, as A, B, C, etc. in FIG. 1, is also determined with a planimeter. The sum of these areas is the area B. Where for a particular composition the area A is determined for example to be 423 sq. cm. and the area B is determined to be 259 sq. cm., B/A yields a crystallinity index of 0.61.

The nongaseous ethylenically unsaturated monomers useful in the invention are solid or liquid. Where solid monomers are used together with initiator systems, the solid monomers can have a melting point range of 25° to 100°C. Where a crystalline composition does not polymerize within a reasonable time when exposed to light at room temperature, as for example where relatively high melting monomers or initiators are used, it may be made to polymerize within a reasonable period of time by exposing the composition at an elevated temperature. The exposure temperature should not be so great however, as to reduce the crystallinity index of the composition below 0.2.

The speed may also be increased by an advantageous aspect of the invention where, for each part by weight of solid monomer, there is included 0.01 to 0.25 parts by weight of a nonpolymeric, normally liquid organic compound which does not inhibit the polymerization of the monomeric material and does not absorb so much of the incident light as to prevent the initiation of the polymerization by the free-radical generating system. The selected liquid organic compound can be present in low concentration and/or have a light absorption band which only partially overlaps the active light absorption band of the free-radical generating system. For example the overlap may be quite small, on the order of 5%, but may be as high as 20% or more, without preventing the initiation of the polymerization by the free-radical generating system. In other cases it will be advantageous to lower the concentration of the liquid or to select another liquid which has little or no overlap in the active light band involved. The additional liquid component usually forms a lower melting eutectic system. The increased disordered regions apparently help to increase the speed of the polymerization, the amount of polymer formed, or both. In certain cases the liquid component may be a polymerizable ethylenic monomer or, more generally, a polymerization initiator. It is to be understood that when such additional liquid component is used, the predominantly crystalline nature of the crystalline layer is not changed; that is, the crysalline layer is dry to the touch and wholly crystalline in all external aspects and may be photopolymerized in the presence of atmospheric oxygen as previously stated.

The additional liquid component makes it possible to use ethylenic monomers with a wider range of melting point. Solid monomers may be used which melt at 25°C. and above. It should be kept in mind that the selected liquid component should be used in small amounts to insure that the final composition is predominantly crystalline at the temperature at which it is to be used.

Another advantageous aspect of the invention is that where, for each part by weight of nongaseous monomer, there is included 0.01 to 250 parts by weight of a nonpolymerizable, crystalline organic solid which does not inhibit the polymerization of the monomeric material and also does not absorb the incident light to such an extent as to prevent the initiation of the polymerization by the free-radical generating system. The discussion above relative to the concentration and overlapping of an absorption band of the initiator by an absorption band of the liquid organic component applies to the nonpolymerizable crystalline organic solids as well.

The crystalline organic solid has a melting point range of 25° to 200°C. It is included to lower the melting point of the composition and/or to form all or part of the crystals which provide the crystal matrix for the active disordered regions. Thus such crystalline solids may be used to reduce the amount of monomer which would otherwise form the crystals, to allow the use of liquid monomers and to provide watersoluble crystals when it is desired that the photopolymerizable composition is to be developable with water, etc. The use of a crystalline solid provides additional flexibility in that the amount of free-radical generating system may be increased; that is, for each part by weight of monomeric material, there can be used 0.001 to 5 parts by weight of free-radical generating system, provided that the free-radical generating system does not exceed 50% by weight of the combined weight of monomer, free-radical generating system and crystalline solid. The ability to use such crystalline solids allows the preparation of crystalline composition with any desired set of characteristics.

While the solid monomer systems polymerize in air, the photopolymerization of most of the crystalline compositions of the invention is faster in vacuum or inert atmosphere than in air. Certain compositions of the invention, as for example some that contain mostly liquid monomers, as previously stated, are sensitive to air. These may be identified by a simple test using a photocalorimeter as discussed below.

The crystalline compositions may be exposed to light of 2000 to 8000 A over a wide range of temperatures. Depending on the purpose involved, such temperatures may range from about −18°C. to about 80°C. and it should be kept in mind that the compositions should be predominantly crystalline at the temperature to be used. The total energy of irradiation, among other factors, determines the amount of polymer formed and the light flux determines the rate of polymerization. In general, light sources delivering 10 to 1000 μw/sq.cm. are employed. Judicious selection of monomer, initiator and additional component, if used, will insure the production of compositions having the prescribed characteristics.

Ease of crystallization, degree of crystallization, and crystalline habit of organic molecules vary over an extremely wide latitude and a procedure is necessary to insure the obtaining of a crystalline layer with the specified crystallinity index of at least 0.2. Layers with an index below 0.2 do not appear to yield satisfactory results. The following are illustrative of the procedures which may be used to prepare the photosensitive compositions of the invention. Steps A through C are amplifications which may be useful in controlling the crystalline habit of the components. It is understood that since the obtained crystalline coatings are light-sensitive, it is necessary to prepare them in the dark or under "safe light" conditions, well known in the photographic arts. Regardless of the method used, however, the end result is a crystalline composition having disordered regions.

PROCEDURE 1

The components of the invention are melted together generally to form a homogeneous melt. The warm molten composition is coated onto the substrate, which may be kept warm initially. The coating and substrate are now cooled or allowed to cool to a selected temperature, often the ambient room temperature. In general, the melt and coatings are prepared at the lowest possible temperatures to avoid thermal polymerization unless otherwise specified.

a. If crystallization occurs spontaneously upon cooling, the crystallinity index may be determined at once and then at appropriate intervals, if desired, to observe any subsequent morphological changes.

b. If the melt supercools, crystallization sometimes occurs spontaneously from this state. It is, however, often advantageously to seed the supercooled melt with a small crystal of one or more of the components to induce crystallization. The same effect may be obtained by mechanical means as by scratching. The crystallinity index may then be determined.

PROCEDURE 2

The components of the invention are dissolved together in a solvent in which the components are preferably completely soluble and the resulting solution is poured or painted onto a substrate. Common solvents such as chloroform, ethanol, acetone, benzene, acetonitrile, and water have all been used advantageously depending on the components and substrate. After putting the solution on the substrate the solvent is evaporated, preferably at an elevated temperature where crystallization does not occur. When the solvent is removed essentially completely, the coating and substrate are now cooled or allowed to cool to a selected temperature, often the ambient room temperature.

a. If crystallization occurs spontaneously upon cooling, the crystallinity index may be determined at once and then at appropriate intervals, if desired, to observe any subsequent morphological changes.

b. If the components supercool, crystallization may occur spontaneously from this state. It is often advantageous, however, to induce crystallization by adding a small crystal of the major component. The crystallinity index may then be determined.

c. If it is not possible to remove all of the solvent before crystallization begins, highly uniform coatings may be difficult to obtain in which case a different procedure may be selected.

PROCEDURE 3

The components of the invention are dissolved in a volatile solvent, such as ethyl ether, acetone, chloroform or hexane. The resulting solution is then sprayed as a fine mist against a chosen substrate. The distance of the substrate is chosen such that the bulk of the solvent evaporates in flight, and either fine crystals or fine oil droplets impinge on the surface of the substrate to produce a uniform frosted appearance. An air-pressure spray gun or a propellant-operated spray cylinder may be used effectively. In order to hasten the in-flight evaporation of solvent, the mist may be passed through a region which is heated by means of a heat lamp or other heat source.

a. If the mist impinges on the substrate surface as fine crystals, which is often the case, the crystallinity index may be determined at once and then at appropriate intervals, if desired, to observe any subsequent morphological changes.
b. If the mist impinges on the substrate surface as fine oil droplets, crystallization often occurs spontaneously within a few hours. Crystallization of the droplets can frequently be accelerated by cooling the reverse surface of the substrate.

PROCEDURE 4

This procedure may be considered as an alternative to Procedure 3. In this method, the components of the invention are melted together generally to form a homogeneous melt. The melt is then sprayed as a fine mist onto a selected substrate surface, employing conventional spraying devices as described in Procedure 3. It is usually desirable to arrange that the spraying device be heated to maintain the molten state of the composition. The uniform coating on the substrate is then treated and tested exactly as described in Procedure 3.

PROCEDURE 5

The components of the invention are mixed together in a vessel which can be heated and which contains an inner surface that can be cooled and whose distance from the mixture can be varied. The selected substrate for coating is affixed to this coolable inner surface. The vessel is so constructed that its internal pressure can be lowered and an inert atmosphere, such as nitrogen, can be maintained if desired. The temperature of the vessel is now slowly raised and the internal pressure adjusted, such that sublimation occurs to produce a uniform crystalline coating on the substrate. The mixture of components may be caused to melt or maintained in the solid state during sublimation. Because of the widely varying melting points and vapor pressures of molecules, it is obvious that the final choice of vessel temperature, internal pressure and inert atmosphere will depend on the specified composition. The crystallinity index is finally determined for the sublimed coating in the usual manner. It is to be noted that the final composition of the coating often varies from that of the components charged due to the differing rates and heats of sublimation of the components.

Procedures 1 through 5 above describe ways of achieving the crystalline, photopolymerizable coatings of this invention. The techniques are those preferred but are not meant to be strictly limiting. Obviously, some latitude in the various procedures must be allowed for, due to the enormous variation in molecular properties and individual crystalline habits. The following points amplify the above procedures.

A. In coatings prepared by Procedures 1 or 2, it is often desirable to induce very fast crystallization in order to cause the formation of a large volume of extremely small microcrystals in the polycrystalline mass comprising the final coating. This technique can be carried out, for example, by plunging a substrate coated with a supercooled melt composition into a cold, inert liquid such as liquid nitrogen. After this quenching, a glassy state results, and the substrate is allowed to warm to ambient temperatures. During this warming process, crystallization often occurs spontaneously and produces extremely fine and uniform crystalline coatings. An advantage of coatings prepared in this particular manner for imaging applications is that a given exposure of actinic radiation produces an unusually large amount of polymeric image compared with coatings prepared by seeding the supercooled melt at ambient temperatures.
B. In coatings prepared by Procedures 1 or 2, it may occur that one or more of the components is insoluble or only partially soluble in the liquid composition or melt. If this obtains, it is usually desirable to have that component present in the finest possible dispersion. In such case the particle size of the insoluble component is reduced by grinding until the particles are less than 0.01 mm in the longest dimension. This is particularly desirable and often necessary for imaging applications, so as to insure high resolution of the image. For other applications it may be desirable to retain the insoluble component as larger crystals for creation of decorative effects as in grained metal or plastic articles, etc.
C. Some of the crystalline coatings may undergo change on aging; for example, the photographic speed may either decrease or increase depending upon the specific crystalline composition in question. One example is provided by coatings prepared from N-vinylsuccinimide and Michler's ketone, whose photographic speed generally increases on aging. Another example is the composition cyclododecanol, benzoin acrylate, Michler's ketone and ethylene diacrylate, whose coating on glass, paper, aluminum and other substrates loses photoimaging speed on aging, which however can be restored by remelting and recrystallizing prior to exposure.

The non gaseous (i.e., at 20°C. and atmospheric pressure), polymerizable ethylenically unsaturated compounds useful in the invention comprise a larger variety of compounds. Those which boil above 90°C. and melt below 200°C. are generally used and it is preferred to employ compounds that melt from about 20°C. to about 100°C. or which boil within the range of 90°–200°C. The compounds preferably have one to four ethylenic groups, for example, compounds that have vinyl, vinylidene or vinylene groups. Specific compounds which can be employed are:

2,6-Bis(acryloxymethyl)naphthalene, m.p., 65°C.
2,6-Bis(methacryloxymethyl)naphthalene, m.p., 89°C.
p-Xylylene diacrylate, m.p., 76°C.
Acrylamide, m.p., 85°C.
p-Xylylene-bis-α-chloroacrylate, m.p., 77°C.
4,4'-Bis(acryloxybiphenyl), m.p., 61°C.
4,4'-Bis(acryloxybenzophenone), m.p., 110°C.
Tetrafluorohydroquinone diacrylate, m.p., 88°C.
8-Acryloxyquinoline, m.p., 56°C.

6-Acryloxyhexyl dionethylammonium-p-toluenesulfonate, m.p., 88°–90°C.
N-6-Acryloxyhexyl-N,N-dimethylphenacrylammonium bromide, m.p., 155°C.
Trimethyl-2-acryloxyethylammonium iodide, m.p., 136°C.
N-Vinylsuccinimide, m.p., 48°C.
4-Acryloxy-4'-dimethylaminobenzophenone, m.p., 104°–105.5°C.
Calcium diacrylate, m.p., 300°C.
N-Vinyl pyrrolidone, liquid, b.p. 95°C./13 mm.
N-(2-Acryloxyethyl)succinimide, m.p., 43°C.
p-Bis(acryloxyethyl)benzene, m.p., 49°C.
2-Vinylnaphthalene, m.p., 64°–65°C.
N-Vinylcarbazole, m.p., 67°C.
N-Isopropylacrylamide, m.p., 67°C.
N-Vinylphthalimide, m.p., 83°C.
Hydroquinone diacrylate, m.p., 88°C.
N-p-Methoxyphenylmethacrylamide, m.p., 92°C.
N-o-Tolylmethacrylamide, m.p., 98°C.
N-Phenyl-N-methylacrylamide, m.p., 75°C. (prepared from reaction of acrylyl chloride with N-methyl aniline)
Resorcinol diacrylate, liquid, (prepared from resorcinol by a procedure similar to that described in Example 12 by substituting resorcinol for 4,4'-dihydroxybenzophenone)
m-Xylylene diacrylate, liquid, (prepared from m-xylylene glycol by a procedure similar to that described in Example 12 by substituting m-xylylene glycol for 4,4'-dihydroxybenzophenone)
3-Acryloxy-4'-diethylaminobenzophenone, liquid, (prepared from the condensation product of 3-methoxybenzanilide and diethylaniline by a procedure similar to that described in Example 34)
3-Acryloxy-4'-dimethylaminobenzophenone, m.p. 68°–70° (prepared from the condensation product of 3-methoxybenzanilide and dimethylaniline by a procedure similar to that described in Example 34)
p-Pentadecylphenylacrylate, liquid, (prepared by a procedure similar to that of Example 12 by substituting p-pentadecylphenol for 4,4'-dihydroxybenzophenone)
2-Acryloxy-4-octyloxybenzophenone, liquid, (prepared by a procedure similar to that of Example 12, by substituting 2-hydroxy-4-octyloxybenzophenone for 4,4'-dihydroxybenzophenone)

Additional compounds which can be used are the alkylene glycol diacrylates disclosed in Martin et al. U.S. Pat. No. 2,927,022 issued Mar. 1, 1960, for example those wherein the ethylenically unsaturated groups, expecially the vinylidene groups, are conjugated with ester or amide structures. The following specific compounds are illustrative of this class: unsaturated esters of alcohols, preferably polyols and particularly such esters of the alpha-methylene carboxylic acids, e.g., ethylene glycol diacrylate, diethylene glycol diacrylate, glycerol diacrylate, glycerol triacrylate, ethylene dimethacrylate, 1,3-propanediol dimethacrylate, 1,2,4-butanetriol trimethacrylate, 1,4-cyclohexanediol diacrylate, 1,4-benzenediol dimethacrylate, pentaerythritol tri-and tetramethacrylate, pentaerythritol di, tri- and tetraacrylates, dipentaerythritol hexacrylate, tripentaerythritol octaacrylate, mannitol hexacrylate, sorbitol hexacrylate, inositol hexacrylate and the corresponding methacrylates, 1,3-propanediol diacrylate, 1,5-pentanediol dimethacrylate, and the like; unsaturated amides, particularly those of the alpha-methylene carboxylic acids, and especially those of alpha, omega-diamines and oxygen-interrupted omega-diamines, such as methylene-bis-acrylamide, methylene-bis-methacrylamide, ethylene-bis-methacrylamide, 1,6-hexamethylene-bis-acrylamide, diethylene-triamine-tris-methacrylamide, bis-(gamma-methacrylamidopropoxy)ethane, beta-methacrylamidoethyl methacrylate, N-(beta-hydroxyethyl)beta-(methacrylamido)ethyl acrylate and N,N-bis(beta-methacryloxyethyl)acrylamide; vinyl esters, such as divinyl succinate, divinyl adipate, divinyl phthalate, divinyl terephthalate, divinyl benzene-1,3-disulfonate, and divinyl butane-1,4-disulfonate; styrene and derivatives thereof and unsaturated aldehydes, such as hexadienal.

A preferred group of monomers, because of the good physical properties and photographic speed of compositions containing them, comprises:

| Solid | Liquid |
|---|---|
| N-phenyl-N-methyl acrylamide | pentaerythritol triacrylate |
| N-vinyl phthalimide | ethylene diacrylate |
| diacetone acrylamide | hexamethylene diacrylate |
| N-vinyl succinimide | triethylene glycol dimethacrylate |
| p-xylylene diacrylate | 3-acryloxybenzophenone |
| 1,4-bis(2-acryloxyethyl)benzene | 2,4-diacryloxybenzophenone |
| pentaerythritol tetraacrylate | N(2-acryloxypropyl)succinimide |
| 4-acryloxybenzophenone | 4-acryloxydiphenylmethane |
| 4-methacryloxybenzophenone | 2-phenyl-2-(p-acryloxyphenyl)-propane |
| N-(2-acryloxyethyl)succinimide | 2-acryloxy-4-octyloxybenzophenone |

A more preferred group of solid monomers comprises:

N-phenyl-N-methyl acrylamide (good physical properties)
pentaerythritol tetraacrylate (good speed)
diacetone acrylamide (water soluble)
4-acryloxybenzophenone (good speed)
N-vinyl succinimide (rapid speed plus good resolution)
1,4-bis(2-acryloxyethyl)benzene (good speed)
N-(2-acryloxyethyl)succinimide (good speed).

A more preferred group of liquid monomers comprises:

2-acryloxybenzophenone (good speed)
2-acryloxy-4-octyloxybenzophenone (good speed)
N-(2-acryloxypropylsuccinimide (good speed; as comonomer it imparts good properties)
2-phenyl-2-(p-acryloxyphenyl)propane (good speed, good shelf life)
4-acryloxydiphenylmethane (good shelf life).

Preferred compositions containing solid monomer for operation in air include:

1,2-Diphenoxyethane, 2-o-chlorophenyl-4,5-di(m-methoxyphenyl)-imidazole dimer, 2-mercaptobenzoxazole, 2,5-bis(p-diethylaminobenzylidene)cyclopentanone, 4-acryloxy-4'-diethylaminobenzophenone 1,2-Diphenoxyethane, 2-o-chlorophenyl-4,5-di(m-methoxyphenylimidazole dimer, 2-mercaptobenzoxazole, and 1,4-bis(2-acryloxyethyl)benzene 1,2-Diphenoxyethane, 2-o-chlorophenyl-4,5-di(m-methoxyphenyl)-imidazole dimer, 2-mercaptobenzoxazole, 4-dimethylamino-4'-(N-n-propyl-N-isoamylamino)benzophenone, and 1,4-bis(2-acryloxyethyl)benzene 1,2-Diphenoxyethane, 2-o-chlorophenyl-4,5-bis(m-methoxyphenyl)-imidazole dimer, 2-mercaptobenzoxazole, Michler's ketone, 2-o-chlorophenyl-4,5-diphenylimidazole dimer, and 4-acryloxybenzophenone Preferred liquid monomer compositions for operation in air include:

Pentaerythritol triacrylate, 1,2-diphenoxyethane, 2-o-chlorophenyl-4,5-di(m-methoxyphenyl)imidazole dimer and 1,3-bis(p-dimethylaminobenzal)acetone.

1,2-diphenoxyethane, 2-o-chlorophenyl-4,5-di(m-methoxyphenyl)imidazole dimer, 2-mercaptobenzoxazole, Michler's ketone, and 3-acryloxybenzophenone 1,2-Diphenoxyethane, 2-o-chlorophenyl-4,5-di(m-methoxyphenyl)imidazole dimer, 2-mercaptobenzoxazole, 3-acryloxybenzophenone, amd 4-dimethylamino-4'-(N-n-propyl-N-isoamylamino)benzophenone 1,2-Diphenoxyethane, 2-o-chlorophenyl-4,5-di(m-methoxyphenyl)imidazole dimer, 2-mercaptobenzoxazole, Michler's ketone, 2-o-chlorophenyl-4,5-diphenylimidazole dimer, and 3-acryloxybenzophenone 1,2-Diphenoxyethane, 2-o-chlorophenyl-4,5-di(m-methoxyphenyl)-imidazole dimer, 2-mercaptobenzoxazole, Michler's ketone, and 2,4-diacryloxybenzophenone 1,2-Diphenoxyethane, 2-o-chlorophenyl-4,5-di(m-methoxyphenyl)-imidazole dimer, 2-mercaptobenzoxazole, Michler's ketone, and N-(2-acryloxypropyl)succinimide 1,2-Diphenoxyethane, 2-o-chlorophenyl-4,5-di(m-methoxyphenyl)-imidazole dimer, 2-o-chlorophenyl-4,5-diphenylimidazole dimer 2-mercaptobenzoxazole, and 4-acryloxydiphenylmethane 1,2-Diphenoxyethane, 2-o-chlorophenyl-4,5-di(m-methoxyphenyl)-imidazole dimer, 2-mercaptobenzoxazole, Michler's ketone, 2,4-diacryloxybenzophenone 1,2-Diphenoxyethane, 2-o-chlorophenyl-4,5-di(m-methoxyphenyl)-imidazole dimer, 2-o-chlorophenyl-4,5-diphenylimidazole dimer, 2-mercaptobenzoxazole, 2-phenyl-2-(p-acryloxyphenyl) propane, and hydroquinonemonomethylether The above preferred compositions have been imaged in air using a light flux of from a few 10's to a few 100's $\mu$w/sq.cm.

The organic, light sensitive free-radical generating system which is free of aliphatic halogen is one which initiates the polymerization of the monomer and does not subsequently terminate the polymerization. Certain compounds are known to be polymerization initiators such as the quinones and compounds containing aliphatic halogen but unfortunately they also interfere with the polymerization at a later stage and hence such compounds are excluded. The word "organic" is used here and in the claims to designate compounds which contain carbon, and one or more of oxygen, hydrogen, nitrogen, sulfur and halogen but no metal.

The free-radical generating system absorbs light within the range of 2000 to 8000 A and has at least one component that has an active light absorption band with a molar extinction coefficient of 100 or more within the range 3300 to 8000 A. "Active light absorption band" means a band of light which is active to produce the free radicals necessary to initiate the polymerization of the monomeric material. The free-radical generating system can comprise one or more compounds which directly furnish free radicals when activated by light. It can also comprise a plurality of compounds one of which yields the free radicals after having been caused to do so by a sensitizer which is activated by the light.

A large number of such compounds can be utilized in the practice of the invention and include Michler's ketone (4,4'-bis(dimethylamino)benzophenone), 4,4'-bis(diethylamino)benzophenone, 4-hydroxy-4'-dimethylaminbenzophenone, 4-hydroxy-4'-diethylaminobenzophenone, 4-acryloxy-4'-dimethylaminobenzophenone, 4-acryloxy-4'-diethylamino benzophenone, 4-methoxy-4'-dimethylaminobenzophenone, benzophenone, and other aromatic ketones; benzoin, benzoin ethers, e.g. benzoin methyl ether, benzoin ethyl ether, benzoin phenyl ether, methylbenzoin, ethylbenzoin; 2,4,5-triarylimidazole dimers such as 2-(o-chlorophenyl)-4,5-di-(m-methoxyphenyl)imidazole dimer, 2-(o-fluorophenyl)-4,5-diphenylimidazole dimer and the like disclosed in U.S. Pat. No. 3,479,185 and in British Pat. Spec's. 997,396 published July 7, 1965 and 1,047,569 published Nov. 9, 1968. An additional imidazole dimer is 2-o-chlorophenyl-4,5-di(m-decyloxyphenyl)imidazole dimer, liquid, which is prepared as follows:

A mixture of 2 g of 3,3'-dimethoxybenzil and 20 ml of 48% hydrobromic acid was stirred at reflux under nitrogen for 21 hours. The mixture was poured into dilute aqueous sodium bicarbonate and filtered to give 1.32 g of dark solid. Recrystallization from benzene-ethanol ("Darco") gave 895 mg of yellow crystals of 3,3'-dihydroxybenzil, m.p. 150°–151°.

A mixture of 60 ml of anhydrouus dimethylformamide, 3.735 g of 3,3'-dihydroxybenzil, 1.5 g of 50% dispersion of sodium hydride in mineral oil, and 8.3 g of 1-iododecane was stirred at 50° for 30 minutes. The mixture was cooled to 5° and filtered. The filter cake was washed with water and recrystallized from acetonitrile to give 4.47 g of pale yellow crystals of 3,3'-didecyloxybenzil, m.p. 57°–59°.

Anal. Calcd. for $C_{34}H_{50}O_4$: C, 78.0; H, 9.64
Found C, 78.52; H, 9.27

A mixture of 4 g of 3,3'-didecyloxybenzil, 1.08 g of o-chlorobenzaldehyde, 45 ml of glacial acetic acid, and 4.6 g of ammonium acetate was stirred at reflux under nitrogen for 2.5 hours, cooled, and poured into 250 ml of cold water. The mixture was filtered, and the filter cake was recrystallized from acetonitrile to give 4.3 g of waxy crystals of 2-o-chlorophenyl-4,5-di(m-decyloxyphenyl)imidazole.

To a stirred solution of 2.18 g of 2-o-chlorophenyl-4,5-di(m-decyloxyphenyl)imidazole and 12 g of potassium hydroxide in 400 ml of ethanol through which a stream of oxygen was bubbled, was added over a period of 1.5 hours a solution of 4.5 g of potassium ferricyanide in 164 ml of water and 286 ml of ethanol. The resulting suspension was diluted with water and extracted with hexane. The hexane extract was twice washed with water, dried over calcium sulfate, and evaporated in vacuo to give 1.7 g of 2-o-chlorophenyl-4,5-di(m-decyloxyphenyl)imidazole dimer as a yellow viscous oil, $\epsilon_{255\ m\mu}^{heptane}$ 22,700.

Anal. Calcd. for $C_{82}H_{108}N_4O_4Cl_2$: C, 76.5; H, 8.47; N, 4.36
Found: C, 76.2; H, 8.54; N, 3.98

2-o-Chlorophenyl-4,5-di(m-amyloxyphenyl)imidazole dimer, a glass, and 2-o-chlorophenyl-4,5-di(m-propyloxyphenyl)imidazole dimer, softening point 70°, can be prepared in an analogous manner.

The imidazole dimers may be used with compounds such as 2-mercaptobenzoxazole with or without sensitizers such as Michler's ketone and various dyes. Additional examples of suitable initiators are those disclosed in Plambeck U.S. Pat. No. 2,760,863 including vicinal ketonic compounds such as biacetyl, benzil, etc.; acyloins such as pivaloin, acetoin, etc.; alpha hydrocarbon substituted aromatic acyloins including alpha-methylbenzoin, alpha-allylbenzoin and alpha-phenylbenzoin. Redox systems, especially those involving dyes, may also be used. These include Rose Bengal/2-dibutylaminoethanol and 2-o-chlorophenyl-3,4-di(m-methoxyphenyl)imidazole/2-mercaptobenzoxazole, etc.

A preferred group of free-radical generating systems characterized by generally good efficiency comprises:
- benzoin ethers such as methyl, ethyl and phenyl;
- methyl benzoin and its ethers such as α-methylbenzoin methyl ether;
- Michler's ketone and its analogs;
- benzophenone (with and without hexanediol);
- 2,4,5-triarylimidazole dimers plus 2-mercaptobenzoxazole (with or without perylene and other sensitizers);
- 2,4,5-triarylimidazole dimers plus Michler's ketone;
- biacetyl.

A more preferred group comprises;
- benzoin ether-methyl, ethyl and phenyl - (high efficiency)
- methyl benzoin and its ethers - (high efficiency)
- Michler's ketone and its analogs - with or without N-arylglycine - (high efficiency)
- 2,4,5-triarylimidazole dimers plus 2-mercaptobenzoxazole (with sensitizers to increase visible wavelength response)
- 2,4,5-triarylimidazole dimers plus Michler's ketone (to increase visible wavelength response).

As previously stated the added component is an organic liquid or solid depending upon the purpose for which it is added as discussed above. Many compounds may be used such as hydrocarbons, acids, amines, alcohols, and the like so long as they satisfy the requirements previously stated. Illustrative examples which may be cited include octadecanol, triethanolamine, stearic acid, cyclododecane, 1,10-decanediol, dimethylaminobenzonitrile, acetoneoxime, desoxybenzoin, nephthalene, N,N'-dimethylhexamethylenediamine, p-diethyoxybenzene, 1,2-diphenylethane, biphenyl, dotriacontane, tetramethylurea, tributylamine, 2-dimethylaminoethanol, bibenzyl, biphenyl, pentamethyl benzene, 1,12-dodecanediol, 1,2-diphenoxyethane, octacosane, trichloroxylene, and cyclododecanol, etc.

A preferred group of solid compounds includes bibenzyl, biphenyl, pentamethyl benzene, octacosane, p-diethoxybenzene, diphenoxyethane, 1-octadecanol, 1-docosanol, cyclododecanol, 1,10-decanediol and 1,12-dodecanediol. These solids are particularly useful for systems comprising N-vinyl succinimide/Michler's ketone with or without a liquid acrylate monomer in providing a good shelf life.

A more preferred group is:
- bibenzyl - (good photographic speed)
- biphenyl - (good photographic speed)
- diphenoxyethane - (good shelf stability)
- p-diethoxybenzene - (good speed)
- octacosane - (good speed and good shelf life)
- 1-octadecanol and cyclododecanol - (form excellent systems with the imidazole dimers, Michler's ketone and ethylene diacrylate)

A particularly preferred group of compositions exhibiting good shelf life without significant loss of photographic speed comprise a. at least one monomer of the formula

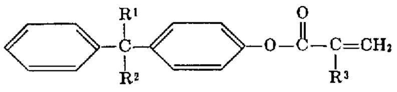

in which $R^1$ and $R^2$, alike or different, are alkyl of up to 4 carbon atoms, i.e., methyl, ethyl, propyl, and butyl;

$R^3$ is hydrogen or methyl;

b. a free radical generating system comprising
  1. 2,4,5-triarylimidazole dimers, for example, 2-(o-chlorophenyl)-4,5-di(m-methoxyphenyl)-imidazole dimer and 2-(o-chlorophenyl)-4,5-diphenylimidazole dimer,
  2. Michler's ketone,
  3. 2-mercaptobenzoxazole, and c. a non-polymerizable crystalline solid.

The compositions of the invention are exposed to light of wavelength in the 2000–8000 A range. Suitable sources of such light, in addition to sunlight, include carbon arcs, mercury-vapor arcs, fluorescent lamps with ultraviolet radiation-emitting phosphors, argon glow lamps, electronic flash units and photographic flood lamps. Other fluorescent light sources such as the tracings on the face of a cathode ray tube may also be used. Where artificial light sources are used the distance between the photosensitive layer and the light source may be varied according to the light sensitivity of the composition and the nature of the photopolymerized polymer, that is, whether the composition is to be used for producing images or to cause bulk polymerization of the monomer.

The base material or support for the photoactive films of this invention may be any natural or synthetic material capable of existing in film or sheet form and can be flexible or rigid. Such supports may be metal sheets or foils, sheets or films of synthetic organic resins of all kinds, including vinyl and condensation polymers, heavy paper such as lithographic paper, and the like. Specific bases include: alumina-blasted aluminum, alumina-blasted "Mylar" polyester film, "Mylar" polyester film, polyvinyl alcohol-coated paper, crosslinked polyester-coated paper, nylon and glass. "Mylar" is a trademark of the Du Pont Co. for poly(ethylene terephthalate).

Certain obvious incompatibilities of photoactive layer and substrate or base should be avoided. For example, oleophilic compositions are not readily coated on glass bases without prior treatment to modify the surface, and compositions containing solvents or softeners for synthetic films should not be coated on substrates made of such synthetic films.

Plates prepared according to the invention can generally be stored in a sealed envelope for 6 months or longer without showing any significant change in sensitivity or speed.

The length of time for which the compositions are exposed to light may vary upward from fractions of a second. The exposure time will vary, in part, according to the nature and concentration of the monomer and initiator and the type of light. Exposure can occur over a wide range of temperatures, as for example from −18°C. up to about 80°C. Preferred exposure temperatures range from 20°C. to 35°C. Flash exposure is also effective and many systems sufficiently approach silver emulsion speeds so as to permit projection exposure and thereby make possible photo-enlargment.

Imagewise exposure, for example in preparing printing plates, is conveniently carried out by exposing a layer of the photoactive composition to light through a process transparency, e.g., a process negative or positive (an image-bearing transparency consisting solely of substantially opaque and substantially transparent areas where the opaque areas are substantially of the same optical density, the so-called line of halftone negative or positive). Many of the systems of this invention are sufficiently fine grained as to reproduce continuous tone transparencies such as negative or positive transparencies of the type obtained by standard silver halide photography.

The exposed photosensitive layer is developed by removing the unpolymerized monomer and leaving behind only the polymeric replica of the original. The polymeric image may be developed by heating under conditions such that some or all of the components are vaporized leaving behind the photopolymer. The conditions of thermal development selected will depend upon the nature of the substrate, the volatility of the components to be removed, and the thermal stability of the components. In general, thermal development can be achieved by use of a hot air knife, by irradiation with a heat lamp, or by contact with a heated surface. It may be desirable in some cases to enhance volatility by applying a vacuum during application of heat. This method also permits recovery of unused components. Many of the low-melting monomers may be vaporized when the exposed plate is heated on a hot plate. For example N-vinylsuccinimide with Michler's ketone or one of the benzoin compounds can be vaporized in a few seconds leaving the photopolymerized areas clearly define. If the quality of the image obtained by thermal development is not sufficiently high, then an alternative method of development may be used such as rinsing in a solvent or combination of solvents which dissolves some or all of the components but does not dissolve the polymeric image. An additional method of developing the image is to melt the composition and bring it in contact with a porous material which absorbs some or all of the components but leaves the polymeric image intact.

Figure 6:
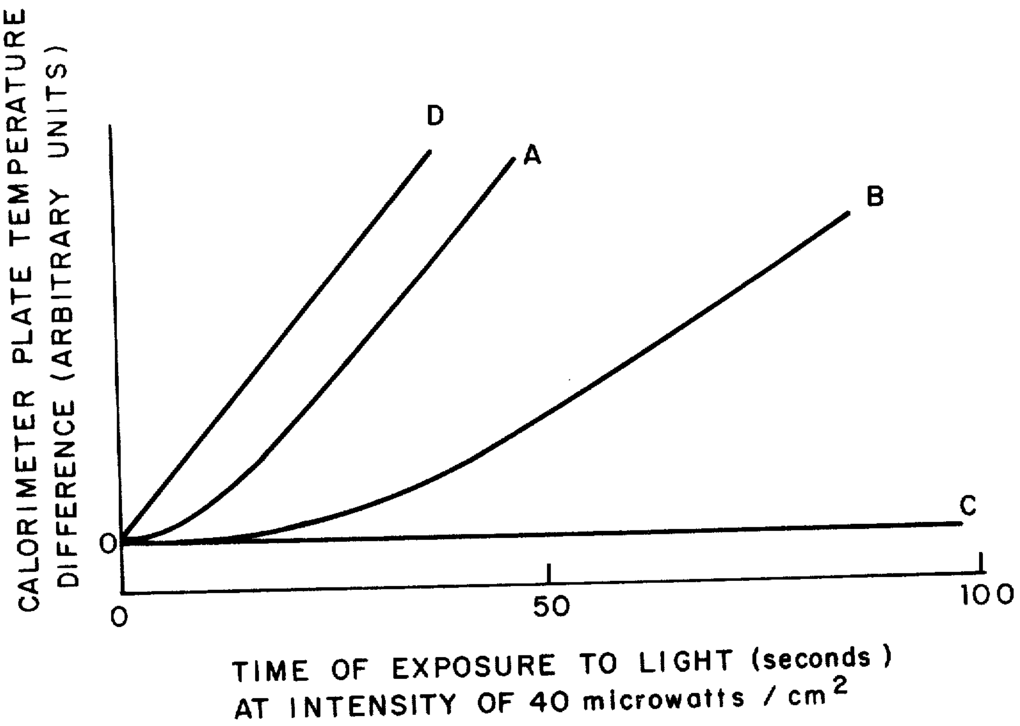
FIG. 6 shows the possible thermal curves of a photopolymerizable composition when exosed to light.

A simple method to measure the amount and rate of photopolymerization is based upon the fact that polymerization evolves heat. A photocalorimeter may be used to measure the temperature difference between a surface coated with a photosensitive composition and an identical non-sensitive control suface when both surfaces receive and absorb exactly the same amount of light. In this instrument, two identical semicircular copper plates, 3 mm. thick and with a radius of 11 mm., are mounted on wooden posts which are 1 mm. thick and 13 mm. long, using a suitable glue such as an epoxy resin. The posts are attached to an aluminum block which is mounted within an air-tight chamber having a vacuum port. The copper plates are coplanar with 1 mm. separation between their straight edges and are joined together by a short length of 5 mil constantan wire. A short length of 5 mil copper wire is attached to each plate and to thick insulated copper wire running to a voltage amplifier. The amplifier is connected to a recorder such as a Moseley XY recorder (10 mv. full scale). The plates are protected from ambient temperature fluctuations by means of the air-tight chamber which is provided with a quartz window for the entry of light. One copper plate is blackened so as to absorb all incident light and act as a control. The crystalline photopolymerizable composition is applied to the other plate and light is shown through the quartz window onto both plates. An electric potential is created at each junction of the constantan wire with the plates. A thermal difference is created when the composition polymerizes and the difference in temperature is displayed as a voltage on the Y axis of the XY recorder. The X axis is a time scale. Thus, since the polymerization evolves heat, the recorder traces a curve with a slope proportional to the polymerization rate. If no polymerization occurs, a straight line parallel to the X axis is traced; see curve C FIG. 6. An "ideal" polymerization might be expected to follow line D of FIG. 6, i.e., the system would show neither inhibition nor retardation. The types of curves observed in practice are shown by curves A and B. The curved portion of curve A is a retardation that precedes the steady state reaction. Curve B is horizontal throughout an inhibition period in which no measurable reaction occurs, followed in turn by a relatively extended retardation and then by the steady state reaction.

Figure 3:
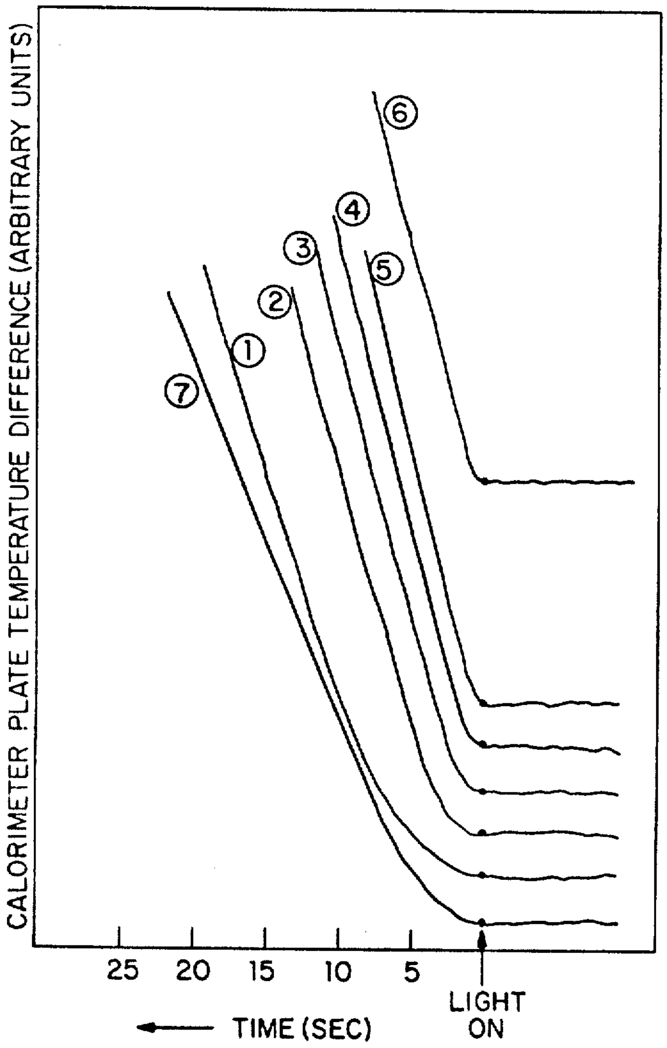
FIG. 3 shows the thermal curves of the composition of Example 3 when exposed to light under various conditions.

The systems containing solid monomers all show no more than slight retardation in the calorimeter test in air, i.e., the time-temperature curve shows an almost immediate rise on the start of irradiation (FIG. 3). The compositions containing liquid monomers are variable in the effect of air on the response of the photopolymerizable composition to irradiation and range from air-sensitive compositions that are strongly inhibited by air to those that show no more than slight retardation. The predominantly crystalline compositions of this invention which are sensitive to air are unique in their polymerization speed in vacuum, in that they yield identifiable images on irradiation of as little as 6 μj/sq.cm., followed by development, whereas the compositions of the art require more than 2000 μj/sq.cm.

Some examples of liquid monomer/crystalline matrix/initiator which operate better in vacuum than in air include:

Hexamethylenediacrylate plus Michler's ketone and one or more of the following:

| | |
|---|---|
| p-Dibromobenzene | Chloronaphthalene |
| Decyl chloride | Bibenzyl |
| p-Diethylaminobenzonitrile | Biphenyl |
| p-Dimethylaminobenzonitrile | Diphenylamine |
| Cyclododecane | 1,3-Dihydroxycyclobutane |
| Benzophenone | Octadecanol |

The test to determine the need for irradiating in vacuum is carried out by coating a photocalorimeter plate with a layer of the photopolymerizable composition and irradiating the plate in air with 1000 μj/sq.cm. of light having a flux density of 10–40 μw/sq.cm. and a frequency appropriate for the sensitizer used. If no heat is evolved the system is considered to require irradiation in vacuum or in an inert atmosphere such as helium or argon, etc.

The compositions of the invention containing solid monomers are not significantly affected by atmospheric oxygen and need no special precautions for use. They can be exposed in atmospheric oxygen without protective cover sheets or coatings since the crystalline nature of the compositions apparently impedes the access of atmospheric oxygen to the polymerizable monomer and initiator sites. By use of the calorimeter referred to above it is relatively easy to determine the minimal effect of atmospheric oxygen on the solid monomer systems. Where there is no atmospheric oxygen present, as for example when the compositions are crystallized and then exposed in a vacuum or in an inert gas, the calorimeter traces a curve which rises almost at once. When air is present the rise of the curve is very slightly delayed. The difference between the compositions of the prior art and the compositions of the invention containing solid monomers may thus be readily demonstrated.

The effect of air on the photoactive compositions of this invention containing solid monomers is limited to causing a brief retardation period and no inhibition. Compositions prepared in an inert atmosphere such as nitrogen, helium or argon show no retardation period but occasionally are found to polymerize thermally, some polymerizing near room temperature. One explanation of this, which should not be construed as limiting the invention, is that the small amount of oxygen absorbed in the photoactive compositions during their preparation is beneficial in protecting them against thermal polymerization during storage. The absorbed oxygen is easily and rapidly scavenged by reactions during the brief retardation period. Reabsorption of sufficient oxygen to cause slight initial retardation may require a few hours. This novel behavior of crystalline compositions containing solid monomers is in contrast to the photopolymerization systems of the art which require cover sheets, and which often are inhibited by as little as a few minutes exposure to air.

Some of the crystalline compositions of the invention exhibit post-polymerization, that is, polymerization of the monomer continues even after the light source is removed. This results in an amplification of the image since with the same dose of light, more polymer is obtained than with a non-post-polymerizing system. Viewed from a different standpoint, post-polymerization yields the same amount of polymer at a lower radiation dosage than a non-post-polymerizing system. The net effect is therefore an increase in photospeed.

Post-polymerization appears to be dependent upon particular combinations of liquid, viscous monomer/matrix/initiator since crystalline compositions containing a solid monomer do not post-polymerize. The effect may be related to the phenomenon known as the Trommsdorff effect in bulk polymerization which is an autoacceleration of polymerization at low conversions due to high local viscosity in the polymerizing region which results in greatly decreased termination rates. Thus a photosensitive composition which exhibits substantial post-polymerization would probably consist of an extremely viscous liquid monomer, probably capable of dissolving its own polymer and resulting in extremely high viscosity at low conversions, and a hostinitiator combination which has very limited solubility in the monomer which probably results in maintenance of the high viscosity liquid region. Each of these factors contributes to high viscosity at low conversion, which results in severely decreased termination rates and hence enables post-polymerization to occur.

Regardless of theory however, the following combinations have been found to exhibit post-polymerization: 1,2-diphenoxyethane, 2-o-chlorophenyl-4,5-di(m-methoxyphenyl)-imidazole dimer, 2-mercaptobenzoxazole plus one of the following unsaturated monomers:

4-n-octyloxy-2-acryloxybenzophenone
2,4-diacryloxybenzophenone
3-acryloxybenzophenone The invention provides novel photopolymerization compositions readily adapted to a variety of applications such as non-silver photography, storage and retrieval of information, formation of self-supported fibers and films, preparation of positive or negative transparent projection slides, lithographic plates, photoresists, application of decorative overlays or other coatings to almost any article. A process of adhesion of two substrates, one or both of which can be transparent, is useful for the application of protective coatings. This process can also be applied to joining opaque bodies; one or both parts to be joined are coated with the photoactive composition, exposed to light and quickly joined.

The photopolymerizable compositions of this invention can be adapted to positive-negative transfer assemblies, e.g., as described in U.S. Pat. No. 3,060,025 and U.S. Pat. No. 3,353,955, and to peel-apart assemblies composed of a substrate/predominantly crystalline composition/transparent cover, the latter having adherence on either the polymerized interlayer or for the nonpolymerized portion of the interlayer. The compositions can contain pigments if desired in order to increase the optical density of the photopolymer or to obtain any of the other advantageous effects of pigments known in the art.

Fibers may be prepared by the photopolymerization of this invention by any of several means. Polymerization of the photoactive composition under a grating comprising parallel alternately opaque and transparent line negative followed by the usual washout or sublimation development leaves an array of parallel fibers that can be stripped from the substrate and applied to usual fiber processing steps such as colddrawing to increase their tenacity. Continuous preparation of fibers or films may be carried out by polymerizing a layer as described above on an endless belt, the photoactive composition being submitted in turn to radiation, heat or solvent development, stripping from the belt and winding up for standard finishing steps.

SPECIFIC EMBODIMENTS OF THE INVENTION

The following examples are intended to be illustrative and not limitative of the invention. All parts are by weight except where otherwise stated. Examples 2 and 4 illustrate the prior art.

EXAMPLE 1

N-Vinylsuccinimide and Michler's Ketone

This example is representative of the crystalline compositions of the invention containing an ethylenically unsaturated monomer and a polymerization initiator.

| | |
|---|---|
| N-vinylsuccinimide | 90% wt. |
| Michler's ketone | 10% wt. |

Figure 2:
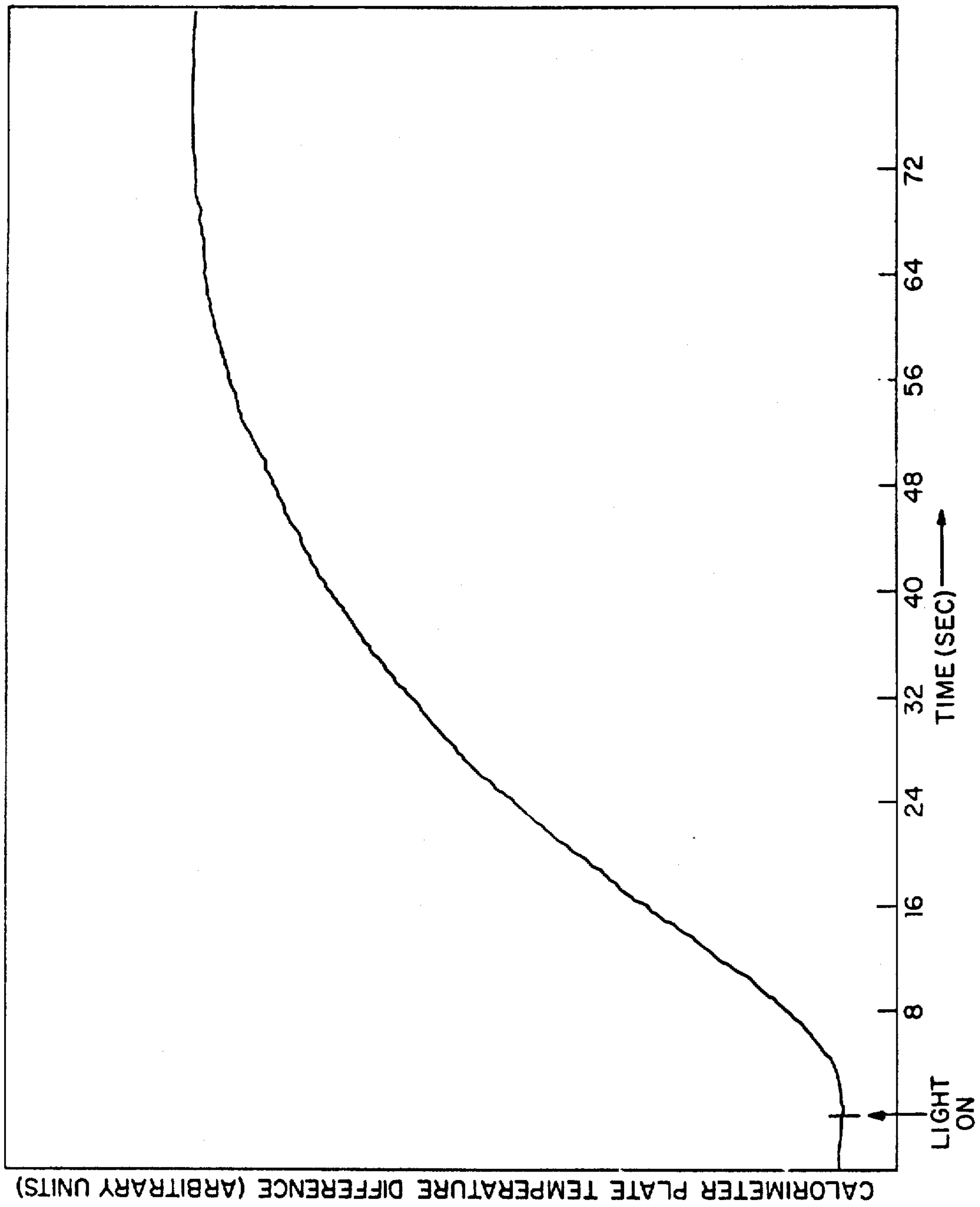
FIG. 2 is the thermal curve of the composition of Example 1 when exposed to light.

Under safe light conditions the two ingredients are melt-crystallized onto one of the two copper plates of a high sensitivity photocalorimeter in an oxygen atmosphere. A substantially dry, predominantly crystalline thin layer having closely arrayed crystals substantially homogeneously distributed therethrough, was obtained. It had a crystallinity index of about 2. With the vacuum port of the calorimeter chamber open to the air, light of 405 mμ (4050 A) was shown through the quartz window simultaneously upon the sample plate containing the photopolymerization composition and the control plate. The composition polymerized as evidenced by the production of heat. The thermal curve obtained by means of the photocalorimeter previously mentioned is shown in FIG. 2 It shows that after a few seconds polymerization started and continued to a maximum in about 72 seconds.

EXAMPLE 2

N-vinylsuccinimide, Michler's Ketone and Cellulose Acetate Butyrate Binder

| | |
|---|---|
| N-vinylsuccinimide | 54% wt. |
| Michler's ketone | 8% wt. |
| Cellulose acetate butyrate resin | 38% wt. |

were, under safe light conditions, dissolved in acetone and cast onto the sample plate of a photocalorimeter in air. A thin film was produced which had a crystallinity index below 0.2. When the air was evacuated from the calorimeter to produce a vacuum, and the sample was irradiated with light of 405 or 436 mμ, heat was generated within 4 seconds of the start of irradiation. However, when air was admitted, no heat was generated even with 76 seconds of irradiation, showing that polymerization occurred in vacuum but not in the presence of air. This Example 2 is representative of the prior art and clearly shows the distinctions between it and the compositions of the invention. The cellulose acetate butyrate resin had 17% butyryl and ASTM viscosity 15. It is available as Eastman Kodak No. 4623.

EXAMPLE 3

N-Vinylsuccinimide and Benzoin Methyl Ether

This example illustrates the behavior of the compositions of the invention in air.

A mixture of 20 mg. of N-vinylsuccinimide and 1 mg. of benzoin methyl ether was melt-crystallized in air on the sample plate of the calorimeter. The sample was exposed to light five times in air at 25 minute intervals. The thermal curve for exposure 1 (FIG. 3) showed a slight initial retardation, which was much reduced in exposures 2 and 3, and was almost absent in exposures 4 and 5. The calorimeter was then filled with argon and exposure 6 was carried out. It showed little initial retardation and the slope was about the same as the maximum slopes in exposures 1–5. Finally, air was reintroduced and the sample was allowed to stand in air for 180 minutes. When exposure 7 was recorded, it exhibited initial retardation as in exposure 1.

These experiments show that after brief retardation, the oxygen at the sites of photopolymerization is completely scavenged and does not reenter from the atmosphere in 25 minutes, but reentry does occur in 180 minutes.

Figure 4:
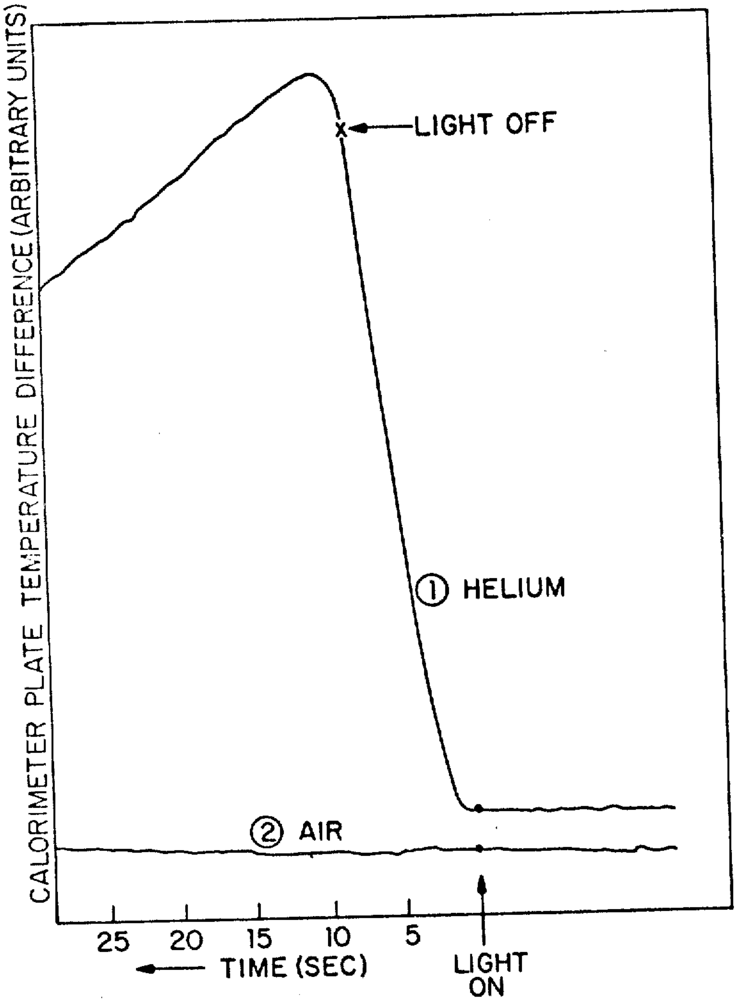
FIG. 4 shows the thermal curves of the composition of Example 4 when exposed to light under different conditions. This example is representative of the prior art.

EXAMPLE 4 p-Xylylene Diacrylate, Benzoin Methyl Ether and Cellulose Acetate Butyrate as a Binder A film containing p-xylylene diacrylate (10 mg.), cellulose acetate butyrate (10 mg.), benzoin methyl ether (2.5 mg.) and chloroform was cast on the calorimeter sample plate using a 16-mil doctor knife. After the solvent evaporated, the material was amorphous and not crystalline. On illumination in an oxygen-free atmosphere of helium rapid photopolymerization was observed but in the presence of air no polymerization was observed (FIG. 4. ). The cellulose resin was Eastman Kodak No. 4623.

Melt-crystallized layers undergo rapid photopolymerization in air after only brief retardation while non-crystalline layers are very severely inhibited by air.

EXAMPLE 5

2,6-Bis(acryloxymethyl)naphthalene and Benzoin Methyl Ether a. A stirred slurry of 5 g of 2,6-bis(hydroxymethyl)-napthalene (J. D. Douros et al. U.S. Pat. No. 3,117,909, January 14, 1964) and 100 ml. of acetonitrile was treated with 5.8 ml. of pyridine and 6.1 ml. of acrylyl chloride. After stirring for 30 minutes, the mixture was concentrated in vacuo to one-half volme, diluted with a large excess of water, and filtered. Crystallization of the filter cake from hexane gave 220 mg. of 2,6-bis(acryloxymethyl)naphthalene, m.p. 63°–65°C.

| | | |
|---|---|---|
| Anal. Calcd. for $C_{18}H_{16}O_4$: | C, 73.0; | H, 5.45 |
| Found: | C, 73.0; | H, 5.56 |
| | 72.6 | 5.45. |

The infrared and nmr spectra of the product are consistent with the assigned structure. Differential thermal analysis of the product showed a melting point endotherm at 62°C. and a polymerization exotherm beginning at 120°C. and peaking at 165°C.

b. A hexane solution of 2,6-bis(acryloxymethyl)-naphthalene containing a trace of benzoin methyl ether was poured onto aluminum foil. Evaporation of the hexane left a dry coating of microcrystals. A portion of the coating was covered with a coin, and the system exposed for 5 seconds to a 275 watt sunlamp. Rinsing the foil in benzene left a negative image of the coin consisting of micrograins in the exposed portion of the foil. Repetition of the experiment without the added benzoin methyl ether gave no image.

EXAMPLE 6

2,6-Bis(methacryloxymethyl)naphthalene and Benzoin Methyl Ether a. A mixture of 5 g. of 2,6-bis(hydroxymethyl)naphthalene, 100 ml. of acetonitrile, 5.8 ml of pyridine, and 7 ml. of methacrylyl chloride was stirred for 30 minutes. The mixture was evaporated in vacuo to small volume diluted with water, and extracted with ether. The ether extract was washed in turn with dilute hydrochloric acid and water. The ether was evaporated in vacuo, and thee residue recrystallized from hexane to give 2.4 g. of 2,6-bis(methacryloxymethyl)naphthalene, m.p., 86°-89°C.

Anal. Calcd. for $C_{20}H_{20}O_4$: C, 74.0; H, 6.20
Found: C, 74.0; H, 6.52.

Differential thermal analysis of the product showed a melting point endotherm at 87° C. and a polymerization exotherm beginning at 110° C. and peaking at 135°C.

b. A hexane solution of 2,6-bis(methacryloxymethyl)-naphthalene containing a small amount of benzoin methyl ether was poured onto aluminum foil. Evaporation of the hexane left a dry coating of microcrystals. A part of this coating was also covered with a coin and the system exposed for 20 seconds to a 275 watt sunlamp. A negative image of the coin as in Ex. 5 was obtained after rinsing the foil in benzene.

EXAMPLE 7 p-Xylylene Diacrylate and Benzoin Methyl Ether

A solution of p-xylylene diacrylate (prepared from the reaction of acrylic acid and p-xylylene glycol in benzene with sulfuric acid as catalyst) and benzoin methyl ether in benzene was poured onto aluminum foil and allowed to evaporate. The dry, crystal layer was partly covered and exposed to indirect sunlight through the window for 10 seconds and dipped in benzene and in acetone. A substantial polymeric image remained on the exposed portion of the foil.

EXAMPLE 8

Acrylamide and Benzoin Methyl Ether

A solution of acrylamide and benzoin methyl ether in acetone was poured over aluminum foil and allowed to dry. The resulting dry, crystalline layer was exposed to indirect sunlight for 3 seconds and then washed with methanol. The exposed portion of the foil retained a polymeric image while the unexposed portion washed clean. EXAMPLE 9

1,4-Bis(β-hydroxyethyl)benzene Diacrylate and Benzoin Methyl Ether a. Dimethyl-p-phenylene diacetate (23 g.) was added portionwise to a stirred slurry of 5 g. of lithium aluminum hydride and 300 ml. of tetrahydrofuran. The mixture was stirred for 1 hours at reflux and then treated carefully with 50 ml of water. The mixture was filtered, the filtrate evaporated in vacuo, and the residue recrystallized from ethylene dichloride ("Darco") to give 15.3 g. of crystals of 1,4-bis(β-hydroxyethyl) benzene, m.p., 87–89°C.

A mixture of 8.3 g. of 1,4-bis(β-hydroxyethyl) benzene, 250 ml. of benzene, 20 ml of acrylic acid, and 0.9 ml. of sulfuric acid was refluxed under a water separator for 1 hour. The solution was washed in turn with water, aqueous sodium bicarbonate, water. The solvent was removed in vacuo to give an oil which crystallized on scratching at −80°C.

Recrystallization from hexane at −80°C. gave 5.4 g. of crystals of 1,4-bis(β-hydroxyethyl)benzene diacrylate, m.p. by differential thermal analysis, about 50°C.

| | | |
|---|---|---|
| Anal. Calcd. for $C_{16}H_{18}O_4$: | C, 70.0; | H, 6.61 |
| Found: | C, 68.7; | H, 6.69 |
| | 69.0 | 6.78. |

The nmr sepctrum of the product was consistent with the assigned structure.

b. This compound, 1,4-bis(β-hydroxyethyl)benzene diacrylate, and a small amount of benzoin methyl ether cast from acetone produced a thin crystalline layer which gave a photoimage after 4 seconds exposure to indirect sunlight using the development procedure of Example 5.

EXAMPLE 10 p-Xylylene-bis-α-chloroacrylate and Benzoin Methyl Ether a. To a stirred solution of 4 g. of p-xylylene glycol, 100 ml. of acetonitrile, and 5.15 ml. of pyridine was added 8 g. of α-chloroacrylyl chloride. The resulting solution was stirred for 30 minutes and then evaporated in vacuo. The residue was treated with water and ether. The ether layer was washed with dilute hydrochloric acid and water, dried over magnesium sulfate, and evaporated in vacuo. The residue was recrystallized from hexane to give 1.5 g. of crystals of p-xylylene-bis-α-chloroacrylate.

| | | |
|---|---|---|
| Anal. Calcd. for $C_{14}H_{12}Cl_2O_4$: | C, 53.4; | H, 3.84 |
| Found: | C, 53.3; | H, 3.97 |
| | 53.5 | 4.15. |

The nmr spectrum of the product confirms the assigned structure. Differential thermal analysis of the product showed a melting point endotherm at 77°C. and an exotherm at 120°C.

b. A thin crystalline layer cast from acetone and containing the above monomer and benzoin methyl ether gave insoluble polymer with just a few seconds exposure to indirect sunlight.

EXAMPLE 11

4,4'-Bis(acryloxymethyl)biphenyl and Benzoin Methyl Ether a. A stirred mixture of 4.3 g. of 4,4°-bis(hydroxymethyl)biphenyl [F. Weygand & R. Mitgau, Chem. Ber. 88, 301 (1955)], 90 ml. of acetronitrile and 4.5 ml. of pyridine was warmed until solution was complete. The solution was allowed to cool to incipient crystallization, and the portionwise addition of 4.5 ml. of acrylyl chloride was begun, and the reaction mixture was cooled in an ice bath. After addition was complete, the mixture was stirred for 1.5 hours at room temperature and then evaporated at reduced pressure. The residue was treated with water and extracted with ether. Evaporation of the ehter gave 700 mg. of colorless crystals of 4,4'-bis(acryloxymethyl)biphenyl. Recrystallization from cyclohexane gave plates with a m.p., 58.8°-60.8°C.

Anal. Calcd. for $C_{20}H_{18}O_4$: C, 74.5; H, 5.63
Found: C, 74.4; H, 5.84.

Differential thermal analysis of the product showed a melting point endotherm at 66°C. and a polymerization exotherm beginning at 190°C. and peaking at 243°C.

b. Imagewise illumination of a crystalline layer of 4,4-°-bis(acryloxymethyl)biphenyl and benzoin methyl ether (cast from acetone solution) with a 275-watt sunlamp for 1 second (distance = 12 inches) followed by rinsing with benzene, gave a polymeric image in the exposed areas.

EXAMPLE 12

4,4°-Bis(acryloxy)benzophenone and Benzoin Methyl Ether a. Acrylyl chloride (2.4 ml.) was added to a stirred mixture of 2.14 g. of 4,4'-dihydroxybenzophenone, 20 ml. of acetonitrile, and 4.2 ml. of triethylamine (ice bath). The mixture was stirred for 30 minutes in the ice bath and 30 minutes at room temperature, filtered, and the filtrate was evaporated in vacuo. The residue was extracted with ether, filtered, and the filtrate was evaporated. The residue was recrystallized from cyclohexane using decolorizing charcoal to give 980 mg. pale cream-colored crystals of 4,4'-bis(acryloxy)benzophenone, m.p., 107°-110°C., ultraviolet (dioxan): $\epsilon_{254}$ 41,100, $\epsilon_{331}$ 306.

Anal. Calcd. for $C_{19}H_{14}O_5$: C, 70.9; H, 4.37
Found: C, 70.7; H, 4.62.

b. An image was formed when a crystalline layer of this monomer with benzoin methyl ether cast from acetone was irradiated by a 275 watt sunlamp for 5 seconds.

EXAMPLE 13

Tetrafluorohydroquinone Diacrylate and Benzoin Methyl Ether a. Acrylyl chloride (2.5 ml.) was added to a stirred solution of 1.8 g. of tetrafluorohydroquinone in 20 ml. of acetronitrile and 4.12 ml. of triethylamine (ice bath). After stirring for 15 minutes at room temperature, the mixture was filtered and the filtrate was concentrated in vacuo to a small vlume. Water and ether were added. The ether layer was dried with magnesium sulfate and evaporated to a mixture of oil and crystals. The residue was dissolved in ether-cyclohexane, washed with aqueous sodium bicrabonate, dried with magnesium sulfate and evaporated. The crystalline residue was recrystallized from heptane to give 920 mg. of tetrafluorohydroquinone diacrylate, m.p., 85°-88°C.

Anal. Calcd. for $C_{12}H_6F_4O_4$: C, 49.7; H, 2.08; F, 26.2
Found: C, 49.5; H, 2.31; F, 25.9.

b. A solution of tetrafluorohydroquinone diacrylate and benzoin methyl ether in acetone was allowed to evaporate on a glass plate to produce a thin crystalline layer having a crystallinity index above 0.2. it was exposed imagewise with a 275 watt sunlamp for 5 seconds. The image could be developed either by rinsing away monomer with benzene or by heating the glass plate above the melting point of the monomer and blotting with absorbent paper leaving only polymer in the exposed portion. The exposed plate could also be developed by heating on a hot plate above 100°C. whereupon monomer melted and vaporized leaving a high quality negative polymeric image.

EXAMPLE 14

8-Acryloxyquinoline and Benzoin Methyl Ether a. Acrylyl chloride (4.5 ml.) was added to a stirred solution of 7.3 g. of 8-hydroxyquinoline in 150 ml. of acetonitrile and 8 ml. of triethylamine cooled (ice bath). The mixture was stirred at room temperature for 30 minutes, filtered, and the filtrate was evaporated in vacuo. The residue was extracted with ether; either extract was filtered and evaporated to give a yellow oil which crystallized on scratching. Recrystallization from hexane gave 5.6 g. of colorless crystals of 8-acryloxyquinoline, m.p., 54°-56°C.

Anal. Calcd. for $C_{12}H_{10}NO_2$: C, 72.4; H, 4.55; N, 7.04
Found: C, 72.5; H, 4.63; N, 7.07.

Differential thermal analysis of the product showed a melting point endotherm at 54°C. and a polymerization exotherm beginning at 165°C. with a crest at 308°C.

b. A thin dry crystalline layer of 8-acryloxyquinoline and benzoin methyl ether cast from solution readily gave a photoimage on irradiation with a sunlamp for 5 seconds.

EXAMPLE 15

6-Acryloxyhexyldimethylammonium p-toluenesulfonate Monohydrate and Benzoin Methyl Ether A solution of 199 mg. of 6-dimethylaminohexyl acrylate (B.P. 81°–83°C./0.6 mm., prepared by the reaction of acrylyl chloride with 6-hydroxyhexyldimethylamine, whose quaternary methiodide, from reaction with methyl iodide, melts at 139°–140°C.) and 190 mg. of p-toluenesulfonic acid monohydrate in acetone-acetonitrile was dried over magnesium sulfate and evaporated in vacuo to a colorless solid. Recrystallization from benzene-cyclohexane gave 205 mg. of colorless crystals of 6-acryloxyhexyldimethylammonium p-toluenesulfonate monohydrate.

| | | | |
|---|---|---|---|
| Anal. Calcd. for $C_{18}H_{29}NO_5S.H_2O$: | C, 55.6; | H, 8.03; | N, 3.60 |
| Found: | C, 55.9; | H, 7.74; | N, 3.56 |
| | 55.6 | 7.75 | 3.16. |

b. A dry crystalline composition of the above monomer with benzoin methyl ether cast from solution was imagewise exposed to sunlamp irradiation for 5 seconds to produce an image which was developed by benzene wash.

EXAMPLE 16

N-(6-Acryloxyhexyl)-N,N-dimethylphenacylammonium Bromide and Benzoin Methyl Ether a. To a solution of 2.2 g. of phenacyl bromide in 40 ml. of cyclohexane was added 2 g. of 6-dimethylaminohexyl acrylate. After 15 minutes the mixture was filtered, and the filter cake recrystallized from acetone to give 1.24 g. of N-(6-acryloxyhexyl)-N,N-dimethylphenacylammonium bromide, m.p., 154.5°–155.5°C. A second crop of 1.25 g. was obtained.

| | |
|---|---|
| Anal. Calcd. for $C_{19}H_{28}NO_3Br$: | C, 57.3; H, 7.09; N, 3.52 |
| Found: | C, 57.6; H, 6.86; N, 3.45. |

UV (acetonitrile): γ280 1790, γ320 sh. 96, γ247 20,900. Differential thermal analysis of the product showed a melting point endotherm at 153°C. and exotherm at 175°C., 255°C., and 345°C.

b. The above monomer undergoes slow polymerization under sunlamp irradiation in the absence of a photoinitiator. Thin, dry crystal layers cast from solutions containing an initiator readily give readable images when irradiated by sunlamp and followed by benzene wash development:

| Initiator | Exposure Time |
|---|---|
| benzoin methyl ether | 5 seconds |
| benzoin acrylate | 2 seconds |

EXAMPLE 17

N-Vinylsuccinimide and Michler's Ketone

Dry crystalline layers of N-vinylsuccinimide and Michler's ketone were cast from acetone solution onto glass plates and exposed imagewise to a 200-watt tungsten iodine lamp delivering $8 \times 10^{14}$ quanta cm.$^{-2}$ sec.$^{-1}$, and the minimal exposure times that produced an image were:

| Composition (% Michler's Ketone) | Shortest Exposure to Produce Image |
|---|---|
| 10% | 1/50 sec. |
| 5% | 1/50 sec. |
| 2% | 1/5 sec. |

EXAMPLE 18

N-Vinylsuccinimide and Michler's Ketone

Under yellow safelight, a supercooled liquid film of 91% N-vinylsuccinimide/9% Michler's ketone was deposited on a glass plate by evaporation of chloroform solvent at room temperature. Crystallization was initiated at one end of the sample by seeding with N-vinylsuccinimide. When crystallization had proceeded across two-thirds of the length of the plate, it was illuminated for 0.5 second with a 1000 watt tungsten lamp (about 100 μj/cm.$^2$). During the exposure, the serrated crystallization front moved about 1 mm. into the remaining liquid.

Washout development of the completely crystallized sample in 7% by volume chloroform/hexane yielded an image of the portion of the coating that was crystalline at the time of the exposure. The portion that was liquid during the exposure did not yield an image. The difference is attributed to inhibition of photopolymerization by oxygen in the liquid film but not in a crystallized coating of the same composition.

EXAMPLE 19

N-(o-Tolyl)methacrylamide and Michler's Ketone

A uniform coating of N-(o-tolyl)methacrylamide (m.p., 97°–98.5°C. prepared from the reaction of methacrylyl chloride with o-toluidine) with 9% of Michler's ketone (m.p., 175°C.) was melt-crystallized on a thin glass plate under yellow safelight. One edge of the sample was then supported on a thermoelectric heater so that one-tenth of the coating could be heated. The temperature was raised over a period of several minutes. The heated portion became soft (but still dry) at about 73°C.

The heater was then cooled to 25°C. and the sample (coated side up) was repositioned so that all of its area would be heated in the subsequent experiment.

The sample plate was divided into zones as shown in the following figure:

| | | | |
|---|---|---|---|
| M | (2) | (3) | (4) |
| | (1) | | |
| M | (5) | (6) | (7) |

The zone M was the portion preheated to determine the softening point, zone (1) was masked to provide, after development, an image-free control, zones (2)–(7) were exposed to white light from a tungsten-iodine lamp as follows:

(2) - 14,000 μj/cm.$^2$ at 25°–30°C.

(3) - 14,000 μj/cm.$^2$ at 66°–70°C. (coating remained hard)

(4) - 14,000 μj/cm.$^2$ at 25°C., after having been heated to 66°–70°C.

(5) - 42,000 μj/cm.$^2$ at 25°–30°C.

(6) - 42,000 μj/cm.$^2$ at 66°–70°C. (coating remained hard)

(7) - 42,000 μj/cm.$^2$ at 25°C., after having been heated to 66°–70°C.

The plate was developed in chloroform/hexane. The image densities were:

2) - low density
(3) - about 2× the density of (5)
(4) - none
(5) - medium density, nearly transparent
(6) -dense, translucent image
(7) - none.

The density for the 14,000 μj/cm.$^2$ exposure at 66°–70°C. was about twice the density for the 42,000 μj/cm.$^2$ exposure at room temperature. Hence, the improvement in imaging speed at the higher temperature was approximately $$2 \times 42{,}000/14{,}000 = 6\text{-fold}.$$

This example shows that exposure at elevated temperature can substantially increase the imaging speed of a high-melting composition. It also illustrates that heat can sometimes desensitize with respect to subsequent exposure at room temperature, perhaps due to a crystalline transformation.

EXAMPLE 20

N-Vinylsuccinimide and Benzoin Methyl Ether

Figure 5:
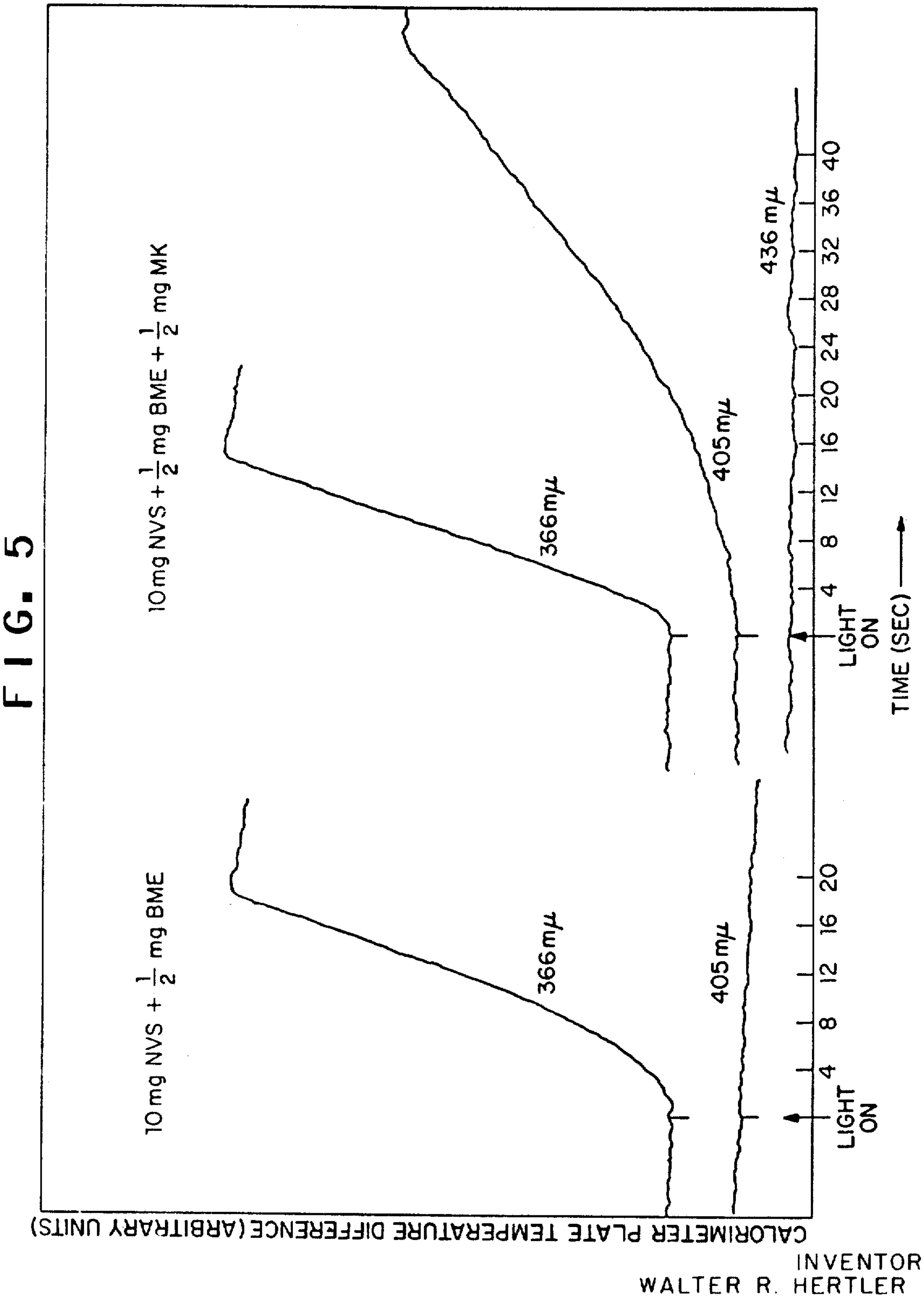
FIG. 5 shows the thermal curves of the composition of Example 20.

A mixture of 10 mg. of N-vinylsuccinimide and 0.5 mg. of benzoin methyl ether was melt-crystallized on a calorimeter sample plate and the photopolymerization curves were recorded using monochromatic light. No polymerization was observed at 405 mμ, but rapid polymerization occurred at 366 mμ. The crystalline layer was melted, 0.5 mg. of Michler's ketone was dissolved in the melt. The melt was crystallized and illuminated again. The crystalline layer was then sensitive to light at 405 mμ but not at 436 mμ (FIG. 5).

EXAMPLE 21

N-Vinylsuccinimide and Michler's Ketone

A mixture of 5 mg. of N-vinylsuccinimide and 1 mg. of Michler's ketone was melt-crystallized on the sample plate of a high-sensitivity calorimeter. Photopolymerization was observed on illumination at 366 mμ and at 405 mμ. No pronounced initial retardation was observed and no evidence was obtained for significant post-polymerization.

EXAMPLE 22

N-Vinylsuccinimide and Michler's Ketone

Light exposures of incrementally increasing doses were made at two wavelengths on different parts of a coating of N-vinylsuccinimide crystallized with 9% of Michler's ketone on glass. Washout development of light-scattering images revealed that the production of an image required a dose between 25 and 50 μj/cm.$^2$ at 4050A, but a dose between 2000 and 3000 μj/cm.$^2$ at 4358A. Thus, the minimum dose to image at 4358A was 40 to 120 fold greater than at 4050A. Comparison of the densities of images produced by higher doses also showed a large difference in sensitivity of the composition at these two wavelengths. On the average the exposure dose at 4358A had to be 60 fold greater than that at 4050A to achieve a similar image.

However, a spectrophotometer recording of the spectrum of such a coating showed that absorption at 4050 A was about 54% and at 4358 A was about 20%, which is a ratio of only 2.8.

To further elucidate this finding, the absorption spectrum of Michler's ketone in different states was measured. The ratio of extinction coefficients at 4050 A vs. 4358 A was 2 to 4 for crystalline deposits of Michler's ketone, but was equal to or greater than 60 for Michler's ketone dissolved in supercooled liquid N-vinylsuccinimide at 25°C., where the spectrum differs greatly from that of crystalline Michler's ketone alone. In ethanol solution, where Michler's ketone has an absorption spectrum similar to that in liquid N-vinylsuccinimide, the ratio was between 60 and 70.

These data indicate that most of the Michler's ketone precipitates in crystalline form upon crystallization of a cooled melt of N-vinylsuccinimide and Michler's ketone. The spectrum of crystalline Michler's ketone thus dominates the absorption spectrum of the composition. However, as shown by these experiments, the imaging sensitivity of the composition does not correspond to the absorption spectrum of crystalline Michler's ketone, but instead to the absorption of Michler's ketone in solution at a low optical density. These observations indicate that the site of photopolymerization is a liquid-like inclusion.

EXAMPLE 23

Various Monomers and Michler's Ketone

Mixtrues of 30 mg. of monomer and 3 mg. of Michler's ketone were coated on glass microscope slides by the method indicated in Table I, and exposed at room temperature and at one-foot distance from 275 watt sunlamp for 20 seconds through a Kodak No. 2 photographic step tablet using the first 17 steps. The slides were than developed as indicated in the table and the number of steps which were visible in the polymeric image recorded.

TABLE I

| | Monomer | M.P., °C. | How Coated | How Developed | No. of Steps |
|---|---|---|---|---|---|
| a) | N-(2-Acryloxyethyl)succinimide | 42–43 | Melt | 20% Benzene in hexane | 5 |
| b) | p-Bis(2-acryloxyethyl)benzene | 46–49 | Melt | 1:1 Benzene:hexane | 1 |
| c) | N-Vinylsuccinimide | 48–50 | Melt | 10% Benzene in hexane | 17 |
| d) | 4,4'-Bis(acryloxymethyl)-biphenyl | 64–65 | Melt | 1:1 Benzene:hexane | 11 |
| e) | 2-Vinylnaphthalene | 64–65.5 | Melt | 20% Benzene in hexane | 7 |
| f) | N-Vinylcarbazole | 65–67 | Melt | Methanol | 17 |
| g) | N-Isopropyl acrylamide | 65.5–67 | Melt | 20% Benzene in hexane | 9 |
| h) | 2,6-Bis(acryloxymethyl)naphthalene | 67–68 | Acetone | 1:1 Hexane:benzene | 8 |

TABLE I—Continued

| | Monomer | M.P., °C. | How Coated | How Developed | No. of Steps |
|---|---|---|---|---|---|
| i) | p-Xylylene diacrylate | 70–76.5 | Melt | 1:1 Hexane:benzene | 4 |
| j) | N-Vinylphthalimide | 81–83 | Melt | 20% Benzene in hexane | 5 |
| k) | 2,6-Bis(methacryloxymethyl)-naphthalene | 83.5–85 | Acetone | 1:1 Hexane:benzene | 13 |
| l) | Acrylamide | 86.5–88 | Melt | Methanol | 6 |
| m) | Hydroquinone diacrylate | 87.5–88.5 | Melt | 1:1 Hexane:benzene | 4 |
| n) | 6-Acryloxyhexyldimethyl-ammonium p-toluenesulfonate | 88–90 | Acetone | Benzene | 13 |
| o) | N-(o-Tolyl)methacrylamide | 97–98.5 | Melt | 1:1 Benzene:hexane | 1 |

EXAMPLE 24

N-Vinylpyrrolidone, Acrylamide and 4,4′-Bis(diethylamino)-benzophenone

A mixture of 20 mg. of N-vinylpyrrolidone, 950 mg. of acrylamide, and 50 mg. of 4,4′-bis(diethylamino)-benzophenone was allowed to crystallize from the melt on glass slides and exposed imagewiseto a 200 watt tungsten iodine lamp. Exposure for 10 seconds followed by vaporization on a hot plate produced a polymeric image.

The following series of examples show the use of free-radical generating systems containing more than one component.

EXAMPLE 25 p-Xylylene Diacrylate, Rose Bengal and 2-Butylaminoethanol

An acetone solution (1 ml.) containing $1.5 \times 10^{-4}$ molar Rose Bengal, 0.004 ml. of 2-butylaminoethanol and 100 mg. of p-xylylene diacrylate and a trace of water to help dissolve the dye was coated on a glass slide and the solvent evaporated. The resulting dry crystalline coating was exposed imagewise to a tungsten iodine lamp (dose rate = $8 \times 10^{14}$ quanta $cm.^{-2}$ $sec.^{-1}$) for 10 seconds. The slide was developed with benzene to obtain a polymeric image.

EXAMPLE 26

N-Vinylsuccinimide, 2-Mercaptobenzoxazole and 2-o-Chlorophenyl-4,5- di(m-methoxyphenyl)imidazole Dimer A mixture of 30 mg. of N-vinylsuccinimide, 0.4 mg. of 2-mercaptobenzoxazole, and 1 mg. of 2-o-chlorophenyl-4,5-bis(m-methoxyphenyl)imidazole dimer was melted, spread on a microscope slide and seeded with N-vinylsuccinimide. The slide containing the resultant dry, crystalline layer was exposed for 5 seconds through a Kodak 1A step tablet to a 275 watt sunlamp at 12 inches distance. After rinsing in 20% benzene in hexane, the polymeric image contained 7 of the 11 steps.

EXAMPLE 27

N-Vinylsuccinimide, 2-Mercaptobenzoxazole, 2-o-Chlorophenyl-4,5- di(m-methoxyphenyl)imidazole Dimer and Hexamethylene Diacrylate N-Vinylsuccinimide (90 mg.) was dissolved in 3 ml. of a solution of 30 mg. of 2-o-chlorophenyl-4,5-bis(m-methoxyphenyl)immidazole dimer, 3.3 mg. of 2-mercaptobenzoxazole, and 6.7 mg. of hexamethylene diacrylate in 10 ml. of acetone. One-third of the resulting solution was placed on a microscope slide heated to about 40°C. When the solvent had evaporated, the slide was cooled to room temperature and seeded with N-vinylsuccinimide. After crystallization of the composition, the slide with its crystallized coating was exposed through a Kodak 1A step tablet for 5 seconds to a 275 watt sunlamp (at 12 inches). The exposed slide was developed by rinsing in 20% benzene in hexane. The resulting polymeric image contained 10 of the 11 steps indicating sensitivity to about 12 $\mu j/cm.^2$.

EXAMPLE 28

N-Vinylsuccinimide, Ethylene Diacrylate, 2-o-Chlorophenyl-4,5-di(m-methoxyphenyl)imidazole Dimer, 4,4′-Bis(dimethylamino)benzophenone, 2-Mercaptobenzoxazole and 2,5-Bis(p-diethylaminobenzylidene)cyclopentanone A solution of 214 mg. of N-vinylsuccinimide, 12 mg. of 2-o-chlorophenyl-4,5-di(m-methoxyphenyl)imidazole dimer, 12 mg. of 4,4′-bis(dimethylamino)benzophenone, 1.6 mg. of 2-mercaptobenzoxazole, 8 mg. of ethylenediacrylate, and 0.2 mg. of 2,5-bis(p-diethylaminobenzylidene)cyclopentanone in 8 ml. of chloroform was coated on glass microscope slides on a warm surface. When the solvent had evaporated the slides were removed from the heated surface and allowed to crystallize. A slide containing the dry crystalline coating was placed in an Exacta 35 mm camera had exposed 15 seconds at f 1.9 to a negative (35 mm on its longest edge) which contained a resolution pattern. Illumination was provided by four General Electric Co. Mardi Gras Movie Lights (MG604 – 50 watts DYV lamp). After development in 9% chloroform in hexane the light scattering polymeric image, which has 2.1 cm. on the longest edge (corresponding to a 17:1 reduction of the original negative), showed a resolution of 107 lines per mm. Exposure of another coated slide at f/4 for 15 seconds in a similar manner gave a polymeric image which has a resolution of 34 lines per mm.

The following series of examples show the inclusion of liquid or solid compounds as previously discussed. As illustrated in Example 29, imaging speed is increased by the addition of minor amounts of N,N′dimethylhexamethylenediamine, tetramethylurea, tributylamine or 2-diethylaminoethanol. Some monomers that melt above about 100°C. are not as fast as could be desired in their speed of photopolymerization and application of the technique of Example 29 effects photopolymerization at a faster rate. Among such monomers are those included in Table II.

TABLE II

| Monomer | M.P., °C. of Monomer |
|---|---|
| 4,4'-Bis(acryloxydiphenyl) ether | 99–101 |
| 4-Acryloxy-4'-dimethylaminobenzophenone | 104–105.5 |
| Benzoin acrylate | 111–113 |
| 4,4'-Bis(acryloxybenzophenone) | 112–113 |
| N-(1-Naphthyl)methacrylamide | 112–113 |
| Methylacrylamide | 112–113 |
| 4-Vinylbiphenyl | 121–122 |
| 6-Acryloxyhexyltrimethylammonium iodide | 139–140 |
| Hexamethylene-bis-acrylamide | 144–145 |
| N-p-Tolylacrylamide | 143.5–145.5 |
| 2-Acryloxyethyltrimethylammonium iodide | 148–149 |

EXAMPLE 29

2,6-Bis(acryloxymethyl)naphthalene, Michler's Ketone and N,N'-Dimethylhexamethylenendiamine A crystalline mixture of 2,6-bis(acryloxymethyl)-naphthalene and 10% of Michler's ketone cast from acetone solution gave a slight image after 5 seconds irradiation with a 275 watt sunlamp followed by rinsing with benzene. When a small amount of N,N'-dimethylhexamethylenediamine was added to the acetone solution of 2,6-bis(acryloxymethyl)-naphthalene and Michler's ketone prior to casting, the resulting crystalline coating gave a much denser polymeric image after only a fraction of a second exposure to the sunlamp followed by rinsing with benzene.

Similarly the exposure time required to produce a detectable polymeric image from crystalline 2,6-bis(acryloxymethyl)naphthalene and Michler's ketone was significantly reduced by addition of a trace of tetramethylurea, tributylamine, or 2-diethylaminoethanol.

EXAMPLE 30

Hexamethylenediacrylate, Michler's Ketone and Stearic Acid

A solution of 150 mg. of stearic acid, 15 mg. of Michler's ketone, and 7 mg. of hexamethylenediacrylate in 5 ml. of chloroform was coated on five glass microscope slides on a warm hot plate. When all of the solvent had evaporated, the slides were allowed to cool and the photoactive composition to crystallize. The slides were exposed for 20 seconds through a Kodak 1A step tablet to a 275 watt sunlamp at a distance of 12 inches and then developed in hexane. The resulting polymeric image contained five out of the eleven steps.

EXAMPLE 31

Ethylene Diacrylate, Benzoin Acrylate, 2-Mercaptobenzoxazole, 2-o-Chlorophenyl-4,5-di(m-methoxyphenyl)imidazole Dimer, 2,5-Bis(p-diethylaminobenzylidene)cyclopentanone and Cyclododecanol In 2 ml. of chloroform were dissolved 54 mg. of cyclododecanol, 6.5 mg. of benzoin acrylate, 5 mg. of 2-o-chlorophenyl-4,5-di(m-methoxyphenyl)imidazole dimer, 3 mg. of 2-mercaptobenzoxazole, 2 mg. ethylene diacrylate, and 0.05 mg. of 2,5-bis(p-diethylaminobenzylidene) cyclopentanone. Two glass slides were coated with the solution and warmed until all of the chloroform had evaporated. The resulting melt was allowed to crystallize and was then exposed for 7 seconds through a Kodak 1A step tablet to a 1000 watt tungsten iodine lamp at a distance of 96 cm. After development in 9% chloroform in hexane, a polymeric image was obtained which contained 11 steps. Similar exposure through a Corning 3–71 filter gave 3 steps in the polymeric image. In the absence of 2,5-bis-(p-diethylaminobenzylidene) cyclopentanone, a 7-second exposure through a 3–71 filter produced no detectable polymer.

EXAMPLE 32

Methacrylic Acid, Michler's Ketone, 2-o-Chlorophenyl-4,5-di(m-methoxyphenyl)imidazole Dimer, 2-Mercaptobenzoxazole, and Cyclododecanol In 4 ml. of chloroform there was dissolved 107 mg. of cyclododecanol, 6 mg. Michler's ketone, 6 mg. of 2-o-chlorophenyl-4,5-di(m-methoxyphenyl)imidazole dimer, 0.5 mg. of 2-mercaptobenzoxazole, and 4 mg. of methacrylic acid. On a glass microscope slide on a hot plate there was coated 1 ml. of this solution. When the chloroform had evaporated, there was left a dry, crystalline layer which was exposed through a Kodak 1A step tablet for 7 seconds to a screened 1000 W tungsten iodine lamp at a distance of 96 cm. Upon being developed in 9% chloroform in hexane, there was obtained a good quality polymeric image with good contrast which contained 8 of the 11 steps.

EXAMPLE 33

Ethylene Diacrylate, 2-o-Chlorophenyl-4,5-di(m-methoxyphenyl)imidazole Dimer, 2-Mercaptobenzoxazole, 4,4'-Bis(diethylamino)benzophenone, 2,5-Bis(-2-methyl-4-diethylaminobenzylidene)cyclopentanone and Cyclododecanol A solution of 214 mg. of cyclododecanol, 0.4 mg. of 2-mercaptobenzoxazole, 7 mg. of 4,4'-bis(diethylamino) benzophenone, 12 mg. of 2-o-chlorophenyl-4,5-di(m-methoxyphenyl)imidazole dimer, 8 mg. of ethylene diacrylate, and 0.1 mg. of 2,5-bis(2-methyl-4-diethylaminobenzylidene) cyclopentanone (prepared by the sodium hydroxide-catalyzed condensation of cyclopentanone with 2-methyl-4-diethylaminobenzaldehyde in aqueous ethanol) in 8 ml. of chloroform was coated on 8 glass microscope slides on a warm hot plate. When the solvent had evaporated the coated slides were allowed to cool and crystallize. The slides were exposed for two minutes through a Kodak 1A step tablet to a calibrated high pressure mercury arc lamp which was used with filter combinations to permit exposure to known doses of 366, 405, and 436 mμ light. Similar exposure to a calibrated tungsten iodine lamp suitably filtered to pass a narrow band of light at 480 mμ was carried out. After exposure the slides were developed in 9% chloroform in hexane, and the number of steps of the step tablet's 11 steps, which were visible in the polymeric image, was determined with the following results:

- at 366 mμ, 8 steps were visible which corresponds to a sensitivity to 2.2 $\mu j/cm^2$
- at 405 mμ, 6 steps were visible which corresponds to a sensitivity to 7 $\mu j/cm^2$
- at 436 mμ, 5 steps were visible which corresponds to a sensitivity to 38 $\mu j/cm^2$
- at 480 mμ, 5 steps were visible which corresponds to a sensitivity to 17 $\mu j/cm^2$.

EXAMPLE 34

Ethylene Diacrylate, 4-Acryloxy-4'-diethylaminobenzophenone, 2-Mercaptobenzoxazole, 2-o-Chlorophenyl-4,5-di(m-methoxyphenyl)imidazole Dimer, 4,4'-Bis(diethylamino)benzophenone, and Cyclododecanol A solution of 214 mg. of cyclododecanol, 0.4 mg. of 2-mercaptobenzoxazole, 7 mg. of 2-o-chlorophenyl-4,5-di-(m-methoxyphenyl)imidazole dimer, 2 mg. of 4-acryloxy-4'-diethylaminobenzophenone, 1 mg. of 4,4'-bis(diethylamino) benzophenone, and 8 mg. of ethylenediacrylate in 8 ml. of chloroform was coated on eight microscope slides on a warm surface. When the chloroform had evaporated, the slides were allowed to cool to room temperature and crystallize. One of the slides was exposed for 2 minutes through a Kodak 1A step tablet to a high pressure mercury arc lamp which was filtered so that only a narrow band of light at 366 mμ passed. After development of the slide in 9% chloroform in hexane, ten of the eleven steps of the step tablet were visible in the polymeric image. This corresponds to a sensitivity to 0.6 μj/cm² at 366 mμ. One of the slides which was similarly exposed for two minutes to a narrow band of light at 405 mμ and developed in the same manner showed 7 steps in the polymeric image which corresponds to a sensitivity of 3.4 μj/cm² at 405 mμ. A third slide similarly showed a sensitivity to 9.6 μj/cm² at 436 mμ (7 steps).

The 4-acryloxy-4'-diethylaminobenzophenone used in this example was prepared in the following way:

A. A mixture of 5 g. of 4-methoxy-4'-diethylaminobenzophenone (prepared using a procedure based on that described in Organic Syntheses Collective Vol. I, page 217 (2nd. Ed. 1951) John Wiley & Sons, Inc.) and 15 ml. of 48% hydrobromic acid was stirred at reflux for 20 hours, and then poured slowly into excess aqueous sodium bicarbonate. The resulting precipitate was collected by filtration and washed with water. Recrystallization from benzene-acetone gave 4.2 g. of pale yellow-green plates of 4-hydroxy-4'-diethylaminobenzophenone.

B. To an ice-cooled stirred solution of 2.69 g. of 4-hydroxy-4'-diethylaminobenzophenone, 2 ml. of triethylamine in 50 ml. of benzene, and 50 ml. of acetonitrile was added 1 ml. of acrylyl chloride. The mixture was stirred for 2 hours at room temperature, filtered, and the filtrate was evaporated using a rotary evaporator. The residual oil cyrstallized on cooling and scratching. Recrystallization from hexane-benzene gave 2.15 g. of crystals of 4-acryloxy-4'-diethylaminobenzophenone, m.p. 89–92.5°, $\lambda_{350\,m}^{benzene}$ 25,700. Recrystallization from cyclohexane raised the m.p. to 95.5°–96.5°.

| | | |
|---|---|---|
| Anal. Calcd. for $C_{20}H_{21}NO_3$: C, 74.5; | H, 6.55; | N, 4.35 |
| Found: C, 74.1; | H, 6.63; | N, 4.27 |
| 74.2 | 6.62 | 4.43 |

Corresponding 4-acryloxy-4'-dimethylaminobenzophenone m.p. 104°–105.5°C., may be prepared by a similar procedure.

EXAMPLE 35

Triethylene Glycol Dimethacrylate, Michler's Ketone, Benzoin Acrylate and Dodecanediol A solution of 107 mg. of dodecanediol, 8 mg. of triethylene glycol dimethacrylate, 3 mg. of Michler's ketone, and 3 mg. of benzoin acrylate in 4 ml. of chloroform and 4 ml. of ethanol was coated on a 1 in. × 3 in. piece of aluminum on a warm hot plate. When the solvent had evaporated, the coated aluminum was removed from the hot plate. The resulting crystalline coating had a crystallinity index of 1.05. It was exposed in contact with a negative transparency containing printed material for 15 sec. to a 1000 w. tungsten iodine lamp at a distance of 96 cm. The plate was developed by treatment with a jet of wet steam for 1 minute. The resulting lithographic plate was of good quality.

EXAMPLE 36

Pentaerythritol Triacrylate, 1,3-Bis(p-dimethylaminobenzal) acetone and Octadecanol Under red safelight a mixture of 67% octadecanol (inert crystalline solid), 30% pentaerythritol triacrylate (liquid monomer) and 3% 1,3-bis(p-dimethylaminobenzal) acetone (initiator) was melted to a homogenous solution and cast on an aluminum plate. On cooling to room temperature the liquid film spontaneously crystallized in a few seconds. The coating was hard and dry and had a crystallinity index of 0.33. Exposure of 70 seconds to a 1000 watt tungsten lamp (3200°K) at 96 cm. in air gave an image when developed by placing the sample on a hot plate for 35 to 50 seconds to volatilize unpolymerized components.

EXAMPLE 37

Hexamethylene Diacrylate, Benzoin Acrylate, Michler's Ketone and Diphenoxyethane A mixture of 0.035 g. hexamethylene diacrylate 0.04 g. benzoin acrylate, 0.04 g. Michler's ketone and 0.32 g. diphenoxyethane was melted and coated on an alumina-blasted aluminum plate. After the layer had crystallized it was exposed in air through a line test pattern transparency to a 100 watt Westinghouse $AH_4$ mercury lamp 20 in. away. The exposed plate was placed on a 480°F. hot plate for 30 seconds to volatilize unreacted materials and produce an image. A faint image was noted for a 1 second exposure and a strong image was obtained for a 2 second exposure. The unexposed crystalline composition had good shelf life.

The compositions of the invention may be further modified to give colored images. One way of accomplishing this is to use a monomer which is either acidic or basic and then react the monomer with a dye that is complementarily basic or acidic. The composition is then exposed to light and developed in the usual way whereby a colored image is produced. Another procedure is to use either an acidic or basic monomer to form the crystalline composition, exposing the composition to light and developing the image as previously disclosed. The image is then treated with a complementarily basic or acid dye to produce a colored polymeric image.

Two examples of the post exposure, post development dyeing procedure where an acidic polymer is first produced, are as follows.

EXAMPLE 38

6-Acrylamidocaproic Acid, Benzoin Methyl Ether and Crystal Violet Dye

Twelve mg. of a composition consisting of 6-acrylamidocaproic acid (20 mg.) and benzoin methyl ether (5 mg.) was melt crystallized on an aluminum plate (4 × 8 cm.). The plate was exposed in air for 10 seconds under a 1A step wedge with a 275 watt sunlamp at a distance of 12 inches. The plate was then developed in hexane: chloroform (9:1) followed by washing with cold running water. The plate was then dipped into an aqueous crystal violet solution (1 mg./10 ml.) giving an instantaneous absorption of the dye onto the photopolymer image. The plate was then rinsed with cold running water and showed a dark violet image of six steps.

EXAMPLE 39

6-Acrylamidocaproic Acid, Benzoin Methyl Ether, Diphexoxyethane and Crystal Violet Dye Sixty mg. of a composition consisting of 6-acrylamidocaproic acid (20 mg.), diphenoxyethane (100 mg.) and benzoin methyl ether (5mg.) was melt crystallized on an aluminum plate (4 × 8 cm.). The plate was exposed in air for 10 seconds under a 1A step wedge with a 275 watt sunlamp at a distance of 12 inches. The plate was then developed in hexane:-chloroform (9:1) followed by washing with cold running water. The plate was then dipped into an aqueous crystal violet solution (1 mg./10 ml.), giving an instantaneous absorption of the dye onto the photopolymer image. The plate was rinsed with cold running water and showed a dark violet image of six steps.

An example of a pre-exposure dyeing procedure where the dye reacts with the monomer is as follows.

EXAMPLE 40

6-Acrylamidocaproic Acid, Benzoin Methyl Ether, Diphenoxyethane and Crystal Violet Dye Sixty mg. of a composition consisting of 6-acrylamidocaproic acid (20 mg.), diphenoxyethane (100 mg.), benzoin methyl ether (5 mg.) and crystal violet (0.5 mg.) was melt crystallized onto an aluminum plate (4 × 8 cm.). The plate was exposed in air for 10 second under a 1A step wedge with a 275 watt sunlamp at a distance of 12 inches. The plate was then developed in hexane:chloroform (9:1) followed by washing with cold running water to give a deep violet image of five steps.

In addition to the acidic monomers shown in the three examples above, other representative monomers that can be used in this aspect of the invention include:

| Acidic | Basic |
|---|---|
| Methacrylic Acid | N-vinyl carbazole |
| Acrylic acid | 8-acryloxy quinoline |
| 2-vinyl propionic acid | 4-vinyl pyridine |
| vinyl acetic acid | 2-dimethylaminoethyl acrylate |
| 2-chloroacrylic acid | 2-dimethylaminoethyl methacrylate |
| 2-furfuryl acrylic acid | 2-diethylaminoethyl acrylate |
| | 2-diethylaminoethyl methacrylate |
| | 2-t-butylaminoethyl methacrylate |
| | 2-vinyl pyridine |
| | 2-vinyl quinoline |
| | 5-vinyl-2-methyl pyridine |

Representative of the dyes which can be used include the following:

| Acidic | Basic |
|---|---|
| Alizarine Red S | Crystal Violet |
| Acid Alizarine Red B | Ethyl Violet |
| Napthal Blue Black B | Malachite Green |
| Victoria Violet 4 BS | Victoria Blue B |
| | Rhodamine B |

The following examples are additional embodiments of the invention.

EXAMAPLE 41

N-Vinylsuccinimide and Benzoin Methyl Ether

A mixture of 5 g. of N-vinylsuccinimide and 1 g. of benzoin methyl ether was dissolved in 50 cc. of ether and the solution was placed in the reservoir of a Nutritional Biochemicals Corporation "universal aerosol spray kit." This solution was sprayed onto a glass plate from a distance of 12-18 inches. The solvent evaporated both in flight and from the small drops of solution on the plate to leave a thin dry crystalline coating. The layer was imaged by exposing it in air to 4050 A light through a photographic step tablet. The scatter image obtained was of good visual quality. An excellent black and white image was obtained when the scatter-image was projected on a screen using transmitted light.

EXAMPLE 42

N-Vinylsuccinimide and Benzoin Methyl Ether

A circuit board blank comprising a copper layer on a non-conductive resin substrate was thoroughly cleaned and an N-vinylsuccinimide/benzoin methyl ether layer was deposited on the copper layer using the aerosol spray technique described in Example 41. The layer was illuminated through a pattern with a mercury spectral lamp at about 30 inches. The image was developed by washing with a hexane/chloroform mixture and the circuit board placed in an acid rapid etch solution. After 30 minutes of gentle agitation, the exposed copper was completely dissolved. The board was then scrubbed with hot water to remove the photopolymer leaving a good copper image. Where the pattern represents an electrical circuit, the process produces printed circuits.

EXAMPLE 43

Hexamethylene Glycol Diacrylate, Michler's Ketone and Desoxybenzoin

A mixture of 1 g. of desoxybenzoin and 0.04 g. of Michler's Ketone and 0.06 g. of hexamethylene glycol diacrylate was melt-coated on a lithoaluminum plate to produce a thin, dry crystalline layer. Imaging was carried out in air for 10 seconds at a distance of 1 foot from a fluorescent lamp and the plate developed by exposing it to heat so as to volatilize non-polymeric substances. A high resolution, easily inked plate was obtained.

EXAMPLE 44

N-Vinylsuccinimide, Hexamethylene Glycol Diacrylate and Michler's Ketone

A mixture of 1 g. of N-vinylsuccinimide and 0.04 g. of Michler's ketone and 0.08 g. of hexamethylene glycol diacrylate was coated onto Magnamat offset master paper, exposed in air with a contact test pattern for 15 seconds to two 15 watt fluorescent lamps at 1 foot distance, developed by thermal volatilization, and 200 copies printed. High quality prints indistinguishable from commercial prints resulted.

EXAMPLE 45

Hexamethylenediacrylate, Michler's Ketone and Stearic Acid

The composition of Example 30 was coated onto Multilith paper and the plate inserted in the focal plane of an enlarger having an f/4.5 lens. Copy was placed on the enlarger table and illuminated with two Sylvania R-32 375 watt photoflood lamps at 1-foot distance from the copy. Exposure for 30 seconds, followed by thermal development, gave a plate that showed good affinity for ink and excellent rejection of ink in the non-exposed areas.

EXAMPLE 46

N-Vinylsuccinimide, Hexamethylene Glycol Diacrylate and Michler's Ketone

A Multilith paper plate coated with a thin, dry crystalline coating of N-vinylsuccinimide (88%), hexamethylene glycol diacrylate (8%) and Michler's ketone (4%) was mounted in contact with a cathode ray tube. Fully resolved images of the cathode ray tube tracings were obtained on exposures amounting to as little as 30–60 μj/cm.².

EXAMPLE 47

N-Vinylsuccinimide and Michler's Ketone

Du Pont sand-blasted aluminum was coated with a thin, dry crystalline coating of N-vinylsuccinimide/-Michler's ketone (96%/4%). The samples were 2 × 2 inches and six were placed in each packet for storage. The packets were an outer layer of kraft paper, a middle layer of aluminum foil, and an inner layer of heat-sealable polyethylene. Packets were heat-sealed in air. A standard test procedure was adopted which consisted of exposing the samples through a $\sqrt{2}$ step wedge. It was established that fresh samples showed the seventh or eighth step easily. Samples were test exposed for 10 seconds to a tungsten iodine lamp at 96 cm. from the sample. Seven to eight steps gave visible images with the newly prepared plates.

| Storage Period | Image Steps | Plate Condition |
|---|---|---|
| 1 week | 7–8 | Good |
| 2 weeks | 10–11 | Some evidence of evaporation at edges |
| 4 weeks | 7–8 | Some evidence of evaporation at edges |
| 7 weeks | 10 | Some evidence of evaporation at edges |
| 16 weeks | 7 | Slight evaporation at edges. |

EXAMPLE 48

N-Vinylsuccinimide, Michler's Ketone and Octadecanol

A mixture of 0.4 g. of octadecanol, 0.2 g. of N-vinylsuccinimide and 0.08 g. of Michler's ketone was melt-coated onto (a) Du Pont aluminum lithomaster base and (b) 500 A Mylar (surface-blasted with 325 mesh alumina) to give dry crystalline coatings on each. The coated plates were exposed through a positive transparency to the light of a Westinghouse AH-4, 100 watt mercury vapor lamp 20 inches away. The plates were next heat-developed using a 250 watt infrared lamp at 8 inches distance.

a. gave a weak image on 1 second exposure and a strong image on 8 seconds exposure;

b. gave a weak image on 4 seconds and a strong image on a 16 seconds exposure.

EXAMPLE 49

N-Vinylsuccinimide, Michler's Ketone, Hexamethylene Glycol Diacrylate and Octadecanol A mixture of 0.4 g. of octadecanol, 0.2 g. of N-vinylsuccinimide, 0.08 g. of Michler's ketone and 0.02 g. of hexamethylene glycol diacrylate was melt-coated onto (a) Du Pont aluminum litho master, and (b) Magnetics Co. (Baltimore, Maryland) yellow litho paper base to give dry crystalline coatings and exposed through a transparent negative. Thermal development as in Example 48 above showed (a) gave a strong image on 1 second exposure and (b) gave a visible image on 1 second exposure.

EXAMPLE 50

N-Vinylsuccinimide and Benzoin Methyl Ether

A strip of spunbonded polyester was sprayed on one surface with an ether solution of N-vinylsuccinimide and benzoin methyl ether. After evaporation of the ether to leave crystalline composition on the fibers, the sample was irradiated for a few seconds by ultraviolet light from a 100 watt mercury lamp filtered through a Corning 7–54 filter. The unreacted monomer and initiator were removed by washing with hexane/methylene chloride. Photographs of the fabric showed that the polyester fibers were linked at crossover points by the newly formed N-vinylsuccinimide polymer.

The following example illustrates details of preparing photoimages using liquid monomer systems.

EXAMPLE 51

Seven plates of each of the following compositions were prepared by melt-casting the mixtures on Du Pont aluminum lithobase:

| Components | a | b | c | d |
|---|---|---|---|---|
| Michler's ketone | 0.04* | 0.04 | 0.04 | 0.04 |
| Hexamethylenedimethacrylate | 0.35 | 0.035 | 0.35 | 0.35 |
| Decanediol | 0.44 | — | — | — |
| Octadecanol | — | 0.44 | — | — |
| Docosanol | — | — | 0.44 | — |
| p-Dimethylaminobenzonitrile | — | — | — | 0.44 |

* Parts by weight.

The samples were exposed under 20 inches of mercury vacuum to the irradiation of an AH4 Westinghouse mercury lamp at a distance to deliver about 30 μw/sq.cm. for varying periods of time. Each plate was halved, one-half heat-developed and the second half washed in 10% chloroform in hexane. It was found that the irradiations required to give an image were (a) 200 μj/sq.cm.; (b) 100 μj/sq.cm.; (c) 200 μj/sq.cm.; and (d) 100 μj/sq.cm.

EXAMPLE 52

1,2-Diphenoxyethane, 2-o-chlorophenyl-4,5-di(m-methoxyphenyl)-imidazole dimer, 2-mercaptobenzoxazole, 2,5-bis(p-diethylaminobenzylidene)cyclopentanone, 4-acryloxy-4'-diethylaminobenzophenone A solution of .85 g of 1,2-diphenoxyethane, 0.048 g of 2-o-chlorophenyl-4,5-di(m-methoxyphenyl)imidazole dimer, 0.0064 g of 2-mercaptobenzoxazole, 0.000125 g of 2,5-bis(p-diethylaminobenzylidene)cyclopentanone, and 0.12 g of 4-acryloxy-4'-diethylaminobenzophenone in 15 ml of chloroform was spraycoated on aluminum, briefly melted by warming under a 250 watt sunlamp at a distance of 4 inches, allowed to recrystallize and exposed in air through a process negative to an AH4 mercury lamp at a distance of 20 inches (20 $\mu$w/cm$^2$). A printable image was obtained with a 1 second exposure after development in 10% by volume of chloroform in hexane. The density of the image can be increased with a longer exposure time. This composition has good shelf life and the image produced from it has good wear life in lithographic printing.

EXAMPLE 53

1,2-Diphenoxyethane, 2-o-chlorophenyl-4,5-di(m-methoxyphenyl)-imidazole dimer, 2-mercaptobenzoxazole, Michler's ketone, and 3-acryloxybenzophenone A solution of .85 g of 1,2-diphenoxyethane, 0.048 g of 2-o-chlorophenyl-4,5-di(m-methoxyphenyl)imidazole dimer, 0.0064 g of 2-mercaptobenzoxazole, .08 g of 3-acryloxybenzophenone (containing about 30% benzene), and 0.008 g of Michler's ketone in 15 ml of chloroform was crystallized on aluminum and exposed, as in Example 52. An image useful for lithographic printing was obtained with a 1 second exposure, and a better image was obtained with a 2 second exposure, after development in 9% chloroform in hexane.

The liquid 3-acryloxybenzophenone was prepared by the reaction of acrylyl chloride with 3-hydroxybenzophenone in the presence of triethylamine.

The above crystalline composition also has good shelf life and produces an image having good wear life in lightographic printing.

EXAMPLE 54

1,2-Diphenoxyethane, 2-o-chlorophenyl-4,5-di(m-methoxyphenyl)-imidazole dimer, 2-mercaptobenzoxazole, 3-acryloxybenzophenone, and 4-dimethylamino-4'-(N-n-propyl-N-isoamylamino)benzophenone a solution of .85 g of 1,2-diphenoxyethane, 0.048 g of 2-o-chlorophenyl-4,5-di(m-methoxyphenyl)imidazole dimer, 0.0064 g of 2-mercaptobenzoxazole, 0.08 g of 3-acryloxybenzophenone (containing about 30% benzene) and 0.008 g of 4-dimethylamino-4'-(N-n-propyl-N-isoamylamino)benzophenone in 15 ml of chloroform was crystallized on aluminum and exposed, as in Example 52. A good image was obtained with a one second exposure after development in 9% chloroform in hexane.

The 4-dimethylamino-4'-(N-n-propyl-N-isoamylamino)benzophenone was prepared as follows: to a stirred ice-cooled solution of 100 g of N-propylaniline and 103 ml of triethylamine in 500 ml of acetonitrile was added dropwise 89 g of isovaleryl chloride. After 1.5 hours the mixture was filtered, and the filtrate was evaporated in vacuo. The residue was extracted with ether, filtered, and the filtrate evaporated in vacuo. The residual oil was treated with 75 ml of tetrahydrofuran and added dropwise to a refluxing slurry of 19.5 g of lithium aluminum hydride and 1 liter of tetrahydrofuran. The mixture was stirred at reflux overnight, decomposed with 40 ml of water, filtered, and the filtrate was evaporated in vacuo. The residue was distilled through a spinning band column giving as a center cut 18.5 g of N-propyl-N-isoamylaniline, b.p. 80°–93°/0.5 mm (identified by nmr.).

A stirred mixture of 6.3 g of p-dimethylaminobenzanilide, 18.5 g of N-propyl-N-isoamylaniline, and 3.24 g of phosphorus oxychloride was heated in an oil bath at 130° until an exothermic reaction raised the temperature of the mixture to 155°. The flask containing the reaction mixture was allowed to cool to 100° and was then heated at 100° for 2 hours. The mixture was treated with 25 ml of an aqueous solution containing 3.3 ml of concentrated hydrochloric acid, heated on the stream bath until homogeneous, treated with 80 ml of water, and then treated with sodium bicarbonate. The resulting tar was extracted with chloroform, dried over calcium sulfate, and poured through a column of basic alumina (elution with chloroform). The effluent was evaporated, and the residue was dissolved in pentane and chromatographed on 400 g of basic alumina. Elution was pentane gave 10.3 g of recovered N-propyl-N-isoamylaniline. Elution with 20% benzene in pentane gave small fractions of oils (1 g). Elution with benzene gave 1.5 g of oils, and elution with chloroform gave, in three fractions, 6.3 g of 4-dimethylamino-4'-N-propyl-N-isoamylaminobenzophenone as yellow oil which became a glass on cooling, $\delta_{348}^{Benzene} = 43,500$.

| | | | |
|---|---|---|---|
| Anal. Calcd. for $C_{23}H_{32}N_2O$: | C, 78.4; | H, 9.16; | N, 7.95 |
| Found: | C, 79.1; | H, 9.13; | N, 8.21 |
| | 78.6 | 9.49 | 7.87 |
| | 78.8 | 9.49 | 8.06 |

EXAMPLE 55

1,2-Diphenoxyethane, 2-o-chlorophenyl-4,5-di(m-methoxyphenyl)-imidazole dimer, 2-mercaptobenzoxazole, and 1,4-bis(2-acryloxyethyl)benzene.

A solution of .852 g of 1,2-diphenoxyethane, 0.048 g of 2-o-chlorophenyl-4,5-di(m-methoxyphenyl)imidazole dimer, 0.0125 g of 2-mercaptobenzoxazole, and .18 g of 1,4-bis(2-acryloxyethyl)benzene in 15 ml of chloroform was crystallized on aluminum and exposed, as in Example 52. A printable image was obtained with a 2 second exposure after development in 9% chloroform in hexane.

EXAMPLE 56

1,2-Diphenoxyethane, 2-o-chlorophenyl-4,5-di(m-methoxyphenyl)-imidazole dimer, 2-mercaptobenzoxazole, 4-dimethylamino-4'-(N-n-propyl-N-isoamylamino)benzophenone, and 1,4-bis(2-acryloxyethyl)benzene A solution of .852 g of 1,2-diphenoxyethane, 0.048 g of 2-o-chlorophenyl-4,5-di(m-methoxyphenyl)imidazole dimer, 0.0125 g of 2-mercaptobenzoxazole, 0.008 g of 4-dimethylamino-4'-(N-n-propyl-N-isoamylamino)benzophenone, and 0.18 g of 1,4-bis(2-acryloxyethyl)benzene in 15 ml of chloroform was coated, exposed and developed as in Example 52. A good image was obtained with a one second exposure.

EXAMPLE 57

1,2-Diphenoxyethane, 2-o-chlorophenyl-4,5-di(m-methoxyphenyl)-imidazole dimer, 2-mercaptobenzoxazole, Michler's ketone, 2-o-chlorophenyl-4,5-diphenylimidazole dimer, and 3-acryloxybenzophenone A solution of 0.852 g of 1,2-diphenoxyethane, 0.01 g of 2-mercaptobenzoxazole, 0.01 g of Michler's ketone, 0.024 g of 2-o-chlorophenyl-4,5-di(m-methoxyphenyl)imidazole dimer, 0.024 g of 2-o-chlorophenyl-4,5-diphenylimidazole dimer, and 0.07 g of 3-acryloxybenzophenone in 15 ml of chloroform was coated, exposed and developed as in Example 52. A good image was obtained with a 1 second exposure.

EXAMPLE 58

1,2-Diphenoxyethane, 2-o-chlorophenyl-4,5-di(m-methoxyphenyl)-imidazole dimer, 2-mercaptobenzoxazole, Michler's ketone, 2-o-chlorophenyl-4,5-diphenylimidazole dimer, and 4-acryloxybenzophenone A solution of 0.852 g of 1,2-diphenoxyethane, 0.01 g of 2-mercaptobenzoxazole, 0.01 g of Michler's ketone, 0.024 g of 2-o-chlorophenyl-4,5-di(m-methoxyphenyl)imidazole dimer, 0.024 g of 2-o-chlorphenyl-4,5-diphenylimidazole dimer, and 0.12 g of 4-acryloxybenzophenone was coated, exposed, and developed as in Example 52. A printable image was obtained with a one second exposure.

EXAMPLE 59

1,2-Diphenoxyethane, 2-o-chlorophenyl-4,5-di(m-methoxyphenyl)-imidazole dimer, 2-mercaptobenzoxazole, Michler's ketone, and 2,4-diacryloxybenzophenone A solution of 0.852 g of 1,2-diphenoxyethane, 0.048 g of 2-o-chlorophenyl-4,5-di(m-methoxyphenyl)imidazole dimer, 0.01 g of 2-mercaptobenzoxazole, 0.01 g of Michler's ketone, and 0.08 g of 2,4-diacryloxybenzophenone in 15 ml of chloroform was coated, exposed, and developed as in Example 52. A useful image was obtained with an exposure of 4 seconds.

This composition, as well as those of Examples 55 and 56, gives images which can be lacquered with a protective coating to enhance wear life in lithographic printing.

The liquid 2,4-diacryloxybenzophenone of the above example was prepared by the reaction of acrylyl chloride with 2,4-dihydroxybenzophenone in the presence of triethylamine.

EXAMPLE 60

1,2-Diphenoxyethane, 2-o-chlorophenyl-4,5-di(m-methoxyphenyl)-imidazole dimer, 2-mercaptobenzoxazole, Michler's ketone, and N-(2-acryloxypropyl)succinimide A solution of 0.852 g of 1,2-diphenoxyethane, 0.048 g of 2-o-chlorophenyl-4,5-di(m-methoxyphenyl)imidazole dimer, 0.01 g of 2-mercaptobenzoxazole, 0.01 g of Michler's ketone, and 0.079 g of N-(2-acryloxypropyl)succinimide in 15 ml of chloroform was coated, exposed, and developed as in Example 52. An image was obtained with a one second exposure. The crystalline composition has an excellent shelf life.

To prepare N-(2-acryloxypropyl)succinimide, succinic anhydride was allowed to react with 1-amino-2-propanol to give N-(2-hydroxypropyl)succinimide (m.p. 87.5-88.5) which upon reaction with acrylyl chloride in the presence of triethylamine gave liquid N-(2-acryloxypropyl)succinimide.

EXAMPLE 61

1,2-Diphenoxyethane, 2-o-chlorophenyl-4,5-di(m-methoxyphenyl)-imidazole dimer, 2-o-chlorophenyl-4,5-diphenylimidazole dimer, 2-mercaptobenzoxazole, and 4-acryloxydiphenylmethane A solution of 0.852 g of 1,2-diphenoxyethane, 0.024 g of 2-o-chlorophenyl-4,5-di(m-methoxyphenyl)imidazole dimer, 0.02 g of 2-o-chlorophenyl-4,5-diphenylimidazole dimer, 0.006 g of 2-mercaptobenzoxazole, and 0.07 g of 4-acryloxydiphenylmethane in 15 ml of chloroform was coated, exposed and developed as in Example 52. A useable image was obtained with a 4 second exposure. This crystalline composition also has an excellent shelf life.

The liquid 4-acryloxydiphenylmethane was prepared by the reaction of acrylyl chloride with 4-hydroxydiphenylmethane in the presence of triethylamine.

EXAMPLE 62

1,2-Diphenoxyethane, 2-o-chlorophenyl-4,5-di(m-methoxyphenyl)-imidazole dimer, 2-mercaptobenzoxazole, Michler's ketone, 2,4-diacryloxybenzophenone A solution of 0.852 g of 1,2-diphenoxyethene, 0.048 g of 2-o-chlorophenyl-4,5-di(m-methoxyphenyl)imidazole dimer, 0.01 g of 2-mercaptobenzoxazole, 0.01 g of Michler's ketone, and 0.08 g of 2,4-diacryloxybenzophenone in 15 ml of chloroform was spray coated onto a 6 × 6 inch A.O. Web Best aluminum plate, exposed with light source of Example 52 at one-fifth atmospheric pressure in air, developed as in Example 52, lacquered with a protective coating, as is well known in the lithographic printing art, and printed on a multilith press. Weak printing was obtained with a 1 second exposure, and good printing was obtained with an exposure of 2 seconds. The press run was 2500 copies indicating good press life.

EXAMPLE 63

1,2-Diphenoxyethane, 2-o-chlorophenyl-4,5-di(m-methoxyphenyl)-imidazole dimer, 2-o-chlorophenyl-4,5-diphenylimidazole dimer, 2-mercaptobenzoxazole, 2-phenyl-2-(p-acryloxyphenyl)propane, and hydroquinonemonomethylether A solution of 0.852 g of 1,2-diphenoxyethane, 0.024 g of 2-o-chlorophenyl-4,5-di(m-methoxyphenyl)imidazole dimer, 0.01 g of Michler's ketone, 0.024 g of 2-mercaptobenzoxazole, 0.08 g of 2-phenyl-2-(p-acryloxyphenyl)propane, and 0.000705 g of hydroquinonemonomethylether was coated, exposed and developed as in Example 52. An image was obtained with a 1 second exposure. The hydroquinonemonomethylether acts to inhibit polymerization of the unsaturated monomer prior to exposure to light and thus increases shelf life.

EXAMPLE 64

2-o-Chlorophenyl-4,5-di(m-methoxyphenyl)imidazole dimer, 2-o-chlorophenyl-4,5-diphenylimidazole dimer, 2-mercaptobenzoxazole, 4,4'-bis(dimethylamino)benzophenone, 2-phenyl-2-(p-acryloxyphenyl)propane, N-(2-acryloxy-n-propyl)succinimide and 1,2-diphenoxyethane A solution of 0.426 g of 1,2-diphenoxyethane, 0.012 g of 2-o-chlorophenyl-4,5-di(m-methoxyphenyl)imidazole dimer, 0.012 g of 2-o-chlorophenyl-4,5-diphenylimidazole dimer, 0.005 g of 2-mercaptobenzoxazole, 0.005 g of 4,4'-bis(dimethylamino)-benzophenone, 0.04 g of 2-phenyl-2-(p-acryloxyphenyl)propane, and 0.005 g of N-(2-acryloxy-n-propyl)succinimide in 7.5 ml of chloroform was coated on aluminum, exposed and developed as in Example 52. After heating the developed plate at 110°C. for 10 seconds, it was treated with a commercial asphaltum gum etching plate preservative and was then used in a multilith machine to print 10,000 copies. There were no signs of plate wear in the areas which had been exposed for 2 seconds.

A particularly convenient development method for the crystalline compositions of this invention makes use of a peelapart process. An article embodying this aspect of the invention is a sandwich which comprises a support sheet, a layer of a predominantly crystalline composition of the invention, one surface of which is adhered to the support sheet, and a transparent sheet adhered to the other surface of the crystalline layer, the crystalline layer having better adhesion to the support sheet than to the transparent sheet. After exposure to light to produce an image, the transparent sheet is stripped or peeled off and carries with it the formed polymeric image. This assembly is prepared by coating a composition of the invention onto a support, such as a film or a metal to which good adhesion is obtained, and, while still in the molten state, the composition is covered with a transparent material such as a polymeric film, as for example polyvinyl alcohol film, etc. The composition is then allowed to crystallize. After imagewise exposure, a developed negative light-scattering polymeric image may be obtained almost instantly by peeling off the transparent material. Image clarification, if needed, can be obtained by wiping off any adhering crystalline residues.

In order for the peel-apart mode of development to operate, it is necessary that there be sufficient adhesion between the crystalline coating and the transparent film so the formed photopolymer will become bound to the film. A way of determining whether a particular polymeric film will be useful as a peel-apart sheet with a particular photosensitive crystalline composition is to cover the composition in its melted state, on a suitable substrate to which good adhesion is obtained (such as a grained metal), with the polymeric film to be tested, allow crystallization to occur, and then peel off the film. If there is little or no resistance to peeling away from the crystals, then that particular polymeric film will probably not be suitable for peelapart development. The peel-apart mode of development is particularly useful in rapidly and simply obtaining hard copy from cathode ray tube images. The resulting polymeric images are suitable for either direct viewing or projecting on a screen.

As illustrated, pigment particles can be added to the crystalline compositions to obtain colored or denser images. A wide variety of pigments may be used, including for example, barium sulfate, barium sulfate-zinc suflide, zinc sulfide, lead carbonate, carbon black, copper phthalocyanine, lead chromate, molybdenum oranges, ultramarine, cadmium sulfide, cadmium selenosulfides, quinacridone (described in U.S. Pat. No. 2,844,484), iron oxide, titanium dioxide, zinc oxide and the like. Dispersion of the pigment particles may be improved by pretreatment of the pigment with materials known in the art such as 3-methacryloxypropyl trimethoxysilane (Union Carbide A–174) or oleic acid, etc.

EXAMPLE 65

1,2-Diphenoxyethane (107 mg), 13 mg of Michler's ketone, 13 mg of benzoin acrylate, 50 mg of pigment grade titanium dioxide (pretreated as described below), and 8 mg of hexamethylene diacrylate in 8 ml of chloroform was coated on a plate of Du Pont aluminum under an infrared heat lamp. When the chloroform had evaporated a piece of polyvinyl alcohol film (pretreated as described below) prepared from Elvanol 72–51 was placed on top of the molten coating, and then crystallization wall allowed to occur. The resulting "sandwich" was then exposed through a process negative from the polyvinyl alcohol side using an AH4 mercury lamp (20 $\mu$w/cm$^2$ below 420 m$\mu$) for varying lengths of time ranging from 1 second to 32 seconds. No image was visible until the polyvinyl alcohol film was peeled off. The polyvinyl alcohol film had adhered to it a light-scattering reverse image of the process negative. There was no apparent difference in image quality between the portion exposed for 1 second and the portion exposed for 32 seconds. Most of the crystalline coating adhered to the aluminum plate, and an image could be seen there also. The image on the polyvinyl alcohol film adhered very strongly and could scarcely be rubbed off. A light rub with a wad of cotton cleared away slight background fog.

The titanium dioxide (anatase) used in this example was moistened with a solution prepared by dissolving 10% by weight of 3-methacryloxypropyltrimethoxysilane (Unoin Carbide Corp. A174) in 0.1% aqueous acetic acid which was then diluted with four volumes of water. The moistened titanium dioxide was then dried in an oven at 60°–65°. The polyvinyl alcohol film used in this example was wiped with this same aqueous solution and dried in an oven at 60°–65°. The treated side of the film was applied against the photosensitive coating.

EXAMPLE 66

A stock solution was prepared by dissolving 1.07 g. of 1,2-diphenoxyethane, 130 mg of Michler's ketone, 130 mg of benzoin acrylate, and 80 mg of hexamethylene diacrylate in 40 ml of chloroform.

A piece of aluminum was coated with 4 ml of the stock solution and heated until the chloroform had evaporated. The molten coating was covered with a piece of polyvinyl alcohol film. On cooling crystallization occurred. The composition was exposed through a process negative portionwise for 1, 5, and 10 seconds to a mercury lamp fitted with a filter system transmitting only at 366 mμ (6.7 μw/cm²). On peeling off, the polyvinyl alcohol film had adhered to it an image in the areas exposed for 5 and 10 seconds. The image was clarified by wiping with cotton. The image accepted ink.

EXAMPLE 67

A mixture of magnetite (Columbian Carbon Company's Mapico black), Ottawa sand, and 1% aqueous hydrolyzed 3-methacryloxypropyl trimethoxysilane prepared in a manner analogous to that described in Example 65 was placed in a bottle and agitated for 2 hours on a paint shaker. The sand was removed by filtration through a Gelman filter, and the magnetite was collected by filtration on a sintered glass filter. The filter cake was washed with 2% aqueous hydrolyzed 3-methacryloxypropyl trimethoxysilane prepared as described in Example 65. THe moist magnetite was dried in an oven at 60°–65°C.

A mixture of 107 mg of 1,2-diphenoxyethane, 13 mg of Michler's ketone, 13 mg of benzoin acrylate, 8 mg of hexamethylene diacrylate, and 50 mg of the pretreated magnetite in 4 ml of chloroform was used to coat a piece of aluminum heated under an infrared lamp. When the chloroform had evaporated, the molten coating was covered with a piece of polyvinyl alcohol film pretreated as in Example 65, and the coating was allowed to crystallize. The composition was exposed through a process negative portionwise for 1, 5, and 10 seconds at 366 mμ (6.7 μw/cm²) with the light source of Example 66. When the polyvinyl alcohol film was peeled off it was found to carry with it a black image which was weak in the region exposed for 1 second and strong in the regions exposed for 5 and 10 seconds.

EXAMPLE 68

In the photosensitive composition of Example 67 25 mg of the magnetite was replaced with 25 mg of titanium dioxide (anatase) pretreated as in Example 65. Exposure as in Example 67 gave a gray image on the polyvinyl alcohol peel-off film in the regions exposed for 5 and 10 seconds.

EXAMPLE 69

A sample of Fisher Dry Process zinc oxide was pretreated by the method described in Example 65 for titanium dioxide. A mixture of 25 mg of the pretreated zinc oxide and 4 ml of the stock solution of Example 66 was used to coat a piece of aluminum heated by an infrared lamp. When the chloroform had evaporated the molten coating was covered with a piece of polyvinyl alcohol film pretreated as in Example 65. The coating was then allowed to cool and crystallize. Exposure at 366 mμ as in Example 67 for one-fifth, 2, and 10 sec. gave a white image on the polyvinyl alcohol peel-off film in the region exposed for 10 seconds.

EXAMPLE 70

Following the procedure of Example 69, but replacing the 25 mg of pretreated zinc oxide with 25 mg of pretreated ferric oxide (hematite), and exposing at 366 mμ (6.7 μw/cm²) for 1,5, and 10 seconds, there was obtained on the polyvinyl alcohol peel-off film a red image in the regions exposed for 5 and 10 seconds.

EXAMPLE 71

Following the procedure of Example 69, but replacing the 25 mg of pretreated zinc oxide with 25 mg of pretreated chromic oxide ($Cr_2O_3$), and exposing at 366 mμ (6.7 μw/cm²) for 1, 5, and 10 seconds, there was obtained on the polyvinyl alcohol peel-off film a green image in the regions exposed for 5 and 10 seconds.

EXAMPLE 72

A mixture of 25 mg of the pretreated titanium dioxide (anatase) of Example 65 and 4 ml of the stock solution of Example 66 was used to coat a piece of alumina-blasted Mylar heated under an infrared lamp. When the chloroform had evaporated, a piece of polyvinyl alcohol film pretreated as in Example 65 was placed on top of the molten coating, and crystallization was permitted to occur. The composition was exposed from the polyvinyl alcohol film side through a transparency to light of wavelength 366 mμ (6.7 μw/cm²) for 1, 5, and 10 seconds. Upon peeling off the polyvinyl alcohol film there was obtained a negative image which was weak in the region exposed for 1 second and strong in the regions exposed for 5 and 10 seconds.

EXAMPLE 73

A sheet of Mylar polyethylene terephthalate film, resin coated as in Example IV of Alles U.S. Pat. No. 2,779,684 and thereafter provided with a thin gelatin coating as described in that patent, was pretreated with aqueous 3-methacryloxypropyl trimethoxysilane using the procedure described in Example 65 for the pretreatment of polyvinyl alcohol film.

A mixture of 107 mg of 1,2-diphenoxyethane, 13 mg of Michler's ketone, 13 mg of benzoin acrylate, 13 mg of triphenylphosphine, 8 mg of hexamethylene diacrylate, 50 mg of titanium dioxide, which was pretreated as in Example 65, and 4 ml of chloroform was used to coat a piece of aluminum which was warmed under an infrared lamp. When the chloroform had evaporated the molten coating was covered with the said pretreated gelatin-subbed Mylar film. The coating was permitted to cool and crystallize, and was then exposed portionwise through a transparency at 366 mμ (6.7 μw/cm²) for 1 second and 11 seconds. Upon peeling off, the gelatin-subbed Mylar film carried a negative image in the region exposed for 11 seconds.

EXAMPLE 74

Polyvinyl alcohol was coated from aqueous solution onto a sheet of gelatin-subbed Mylar (as described in Example 73) and allowed to dry.

A stock solution was prepared by dissolving 856 mg of 1,2-diphenoxyethane, 48 mg of 2-o-chlorophenyl-4,5-di(m-methoxyphenyl)imidazole dimer, 6.4 mg of 2-mercapto benzoxazole, 120 mg of 4-acryloxybenzophenone, and 1 mg of 2,3-bis(p-diethylaminobenzylidene)cyclopentanone in 25 ml of chloroform.

A mixture of 3 ml of the stock solution and 30 mg of titanium dioxide (anatase) pretreated as described in Example 65 was coated on the sheet of polyvinyl alcohol coated gelatin-subbed Mylar film, and heated under an infrared lamp. When the chloroform had evaporated a second piece of the same film was placed on top of the melted coating and crystallization was allowed to occur. The composition was exposed through a process negative at 366 mμ (6.7 μw/cm²) for 5, 10, and 20 seconds. Upon peeling apart, a negative image was observed on the film through which the exposure occured in the regions exposed for 10 and 20 seconds. A somewhat weaker negative image appeared on the other film where a slight image appeared in the region exposed for 10 seconds, and a better image appeared in the region exposed for 20 seconds.

EXAMPLE 75

A mixture of 3 ml of the stock solution of Example 74 and 30 mg of titanium dioxide (anatase) pretreated as described in Example 65 was coated on a piece of polyvinyl alcohol-coated gelatin-subbed Mylar (as in Example 73) heated under an infrared lamp. When the chloroform had evaporated, the molten coating was covered with a piece of Mylar film and allowed to cool and crystallize. The composition was exposed from the polyvinyl alcohol-coated side through a process negative at 366 mμ (6.7 μw/cm²) for 5, 10, and 20 seconds. The polyvinyl alcohol-coated film after peeling off and wiping with cotton carried a negative image in the regions exposed for 10 and 20 seconds.

EXAMPLE 76

A mixture of 4 ml of the stock solution of Example 66 and 25 mg of untreated titanium dioxide (anatase) was coated on a piece of aluminum heated under an infrared lamp. When the chloroform had evaporated the molten coating was covered with a sheet of untreated polyvinyl alcohol film (prepared from Elvanol 72–51). The coating was then allowed to crystallize and was exposed through a process negative at 366 mμ (6.7 μw/cm²) for 1, 5, and 10 seconds. The polyvinyl alcohol film was peeled off and found to carry an image in the regions exposed for 5 and 10 seconds. The image was clarified by rubbing with cotton. Exposure of a similar composition for 120 sec. at 366 mμ (6.7 μw/cm²) through a Kodak 1A step tablet gave an image containing six (of the eleven) steps.

EXAMPLE 77

A sample of titanium dioxide (anatase) was wet with a 2% solution of oleic acid in acetone and dried in an oven at 60°–70° for 1 hour. A mixture of 3 ml of the stock solution of Example 74 and 30 mg of the oleic acid-treated anatase (which suspended very well in the stock solution) was coated on a warm piece of aluminum heated by an infrared lamp. When the chloroform had evaporated the molten coating was covered with a piece of polyvinyl alcohol-coated gelatin-subbed Mylar (as in Example 74) and the coating crystallized upon cooling. The composition was exposed through a process negative for 5, 10, and 30 seconds at 366 mμ (6.7 μw/cm²). The film was peeled off and found to contain an image in the regions exposed 5, 10, and 30 seconds.

EXAMPLE 78

Using the composition and exposure method of Example 77, the exposed composition was heated to 51° in an oven, and at that temperature the film was peeled off. The background fog was even less than that when the film was peeled off at room temperature.

EXAMPLE 79

A mixture of 214 mg of 1,2-diphenoxyethane, 12 mg of Michler's ketone, 12 mg of 2-o-chlorophenyl-4,5-di(m-methoxyphenyl)imidazole dimer, 1 mg of 2-mercaptobenzoxazole, 0.2 mg of 2,5-bis(p-diethylaminobenzylidene)cyclopentanone, 16.1 mg of hexamethylene diacrylate, 25 mg of the pretreated titanium dioxide (anatase) of Example 65, and 8 ml of chloroform was used to coat small plates of aluminum while heating under an infrared lamp. When the chloroform had evaporated the molten coatings were covered with pieces of the pretreated polyvinyl alcohol film of Example 65 and allowed to crystallize. The plates were then singly mounted in the back of a 35 mm Exacta camera and exposed at f/5.6 for various lengths of time toward an adjacent stone building. The plates were "developed" by removing from camera, peeling off the film and wiping briefly with cotton to clarify. The resulting white light scattering image of the stone building when viewed against a piece of black paper as a film backing appeared as a direct positive black and white photograph. Alternatively, projection of the image on the film onto a projection screen gave a negative image. The optimum quality with this composition was obtained with a 10 to 15 second exposure.

The monomeric compounds of the formula

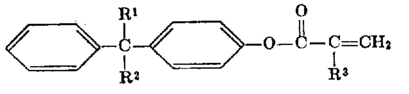

where the R groups are as previously defined may be readily prepared as follows.

Preparation of p-(α,α-Dimethylbenzyl)phenyl Acrylate $R^1 = R^2 = CH_3$ $R^3 = H$ A benzene solution of 20.0 g (0.095 mole) of 2-phenyl-2-(p-hydroxyphenyl)propane and 9.5 g (0.095 mole) of triethylamine was cooled to 15°C. and 8.5 g (0.095 mole) of acrylyl chloride in 50 ml of benzene added over 30 minutes while the temperature was maintained at 15°C.

After the addition was complete, the solution was stirred an additional 2 hours at room temperature. The triethylamine hydrochloride was removed by filtration and the filtrate washed with water. The solution was dried over anhydrous magnesium sulfate. The magnesium sulfate was removed by filtration and the solvent stripped. The resulting liquid was purified by passage through a neutral alumina column. The product, p-($\alpha$,$\alpha$-dimethylbenzyl)phenyl acrylate, eluted with 1:1 n-hexane-benzene, was 11.0 g.

This was identified by infrared and nuclear magnetic resonance spectra.

| | | |
|---|---|---|
| Anal. Calcd. for $C_{18}H_{18}O_2$: | C, 81.17; | H, 6.81 |
| Found: | C, 81.33; | H, 6.49 |
| | 81.49 | 6.66. |

Preparation of p-($\alpha$,$\alpha$-Dimethylbenzyl)phenyl Methacrylate $$R^1 = R^2 = R^3 = CH_3$$

A benzene solution of 15.0 g (0.071 mole) of 2-phenyl-2-(p-hydroxyphenyl)propane and 7.3 g (0.071 mole) of triethylamine was cooled to 5°C. and 7.4 g (0.071 mole) of methacrylyl chloride in 100 ml of benzene added over a 30-minute period while maintaining the temperature between 5°–10°C.

After the addition was complete, the solution was allowed to warm to room temperature and stirred an additional 4 hours.

The triethylamine hydrochloride salt was removed by filtration, the filtrate washed with two 100 ml portions of water and dried with anhydrous magnesium sulfate. The drying agent was removed by filtration and the filtrate evaporated to a very thick oil. The p-($\alpha$,$\alpha$-dimethylbenzyl)phenyl methacrylate was purified by elution chromatography through a neurral alumina column. This gave 11.5 g of product which was identified by infrared and nuclear magnetic resonance spectrography.

| | | |
|---|---|---|
| Anal. Calcd. for $C_{19}H_{20}O_2$: | C, 81.39; | H, 7.19 |
| Found: | C, 80.59; | H, 7.01 |
| | 80.58 | 7.11. |

EXAMPLE 80

| | |
|---|---|
| Diphenoxyethane | 0.852 g |
| 2-o-Chlorophenyl-4,5-di(m-methoxyphenyl)-imidazole dimer | 0.028 g |
| 2-o-Chlorophenyl-4,5-diphenylimidazole dimer | 0.028 g |
| Michler's ketone | 0.010 g |
| 2-Mercaptobenzoxazole | 0.020 g |
| p-($\alpha$,$\alpha$-Dimethylbenzyl)phenyl acrylate | 0.090 g |

were dissolved in 15 ml of chloroform and sprayed from 6" onto 5 × 5 inches aluminum plates, using a Binks Company Model 59–1000/"A" air brush. The coated plates were heated to 100°C. on a hot plate until the coating melted, after which the compositions were allowed to crystallize.

The photographic speed of one such plate freshly prepared as above was determined by exposure to radiation from a medium pressure mercury lamp delivering 20 $\mu$j/cm²/sec in increments of 1, 2, 4, 8, 16, 32, and 64 seconds (20 $\mu$j to 1280 $\mu$j/cm² total exposure). A total of 80 $\mu$j/cm² gave an image that could be used to print numerous copies.

The remaining plates were stored and tested after varying periods of time. After 4 weeks storage, there was no loss of speed, 80 $\mu$j/cm² sufficing to give a good image and after 26 weeks storage the speed had decreased to require 160 $\mu$j/cm² for a good image.

EXAMPLE 81

The composition:

| | |
|---|---|
| Diphenoxyethane | 0.852 g |
| 2-o-Chlorophenyl-4,5-di(m-methoxyphenyl)-imidazole dimer | 0.024 g |
| 2-o-Chlorophenyl-4,5-diphenylimidazole dimer | 0.024 g |
| 2-Mercaptobenzoxazole | 0.010 g |
| Michler's ketone | 0.010 g |
| p-($\alpha$,$\alpha$-Dimethylbenzyl)phenyl acrylate | 0.080 g |
| N-2-Acryloxypropylsuccinimide | 0.005 g |
| 4-Methoxyphenol | 0.010 g |

was used to coat plates as in Example 80. The initially prepared and stored compositions required the following amounts of radiation to produce good printing plates:

| | |
|---|---|
| initially | 80 $\mu$j/cm² |
| 6 weeks | 80 $\mu$j/cm² |
| 10 weeks | 80 $\mu$j/cm² |
| 18 weeks | 160 $\mu$j/cm² |
| 36 weeks | 320 $\mu$j/cm² |

The following compositions were dissolved in chloroform and sprayed onto plates as described in Example 80.

EXAMPLE 82

| | |
|---|---|
| 1,2-Diphenoxyethane | 0.850 g |
| 2-o-Chlorophenyl-4,5-di(m-methoxyphenyl)imidazole dimer | 0.048 g |
| 2-o-Chlorophenyl-4,5-diphenyl-imidazole dimer | 0.048 g |
| Michler's ketone | 0.010 g |
| 2-Mercaptobenzoxazole | 0.010 g |
| p-($\alpha$,$\alpha$-Dimethylbenzyl)phenyl acrylate | 0.080 g |
| 4-Benzyl-1,3-phenylene diacrylate | 0.001 g |

The plates required the following exposure after varying periods of storage:

| | |
|---|---|
| initial exposure | 80 $\mu$j/cm² |
| 2 weeks | 80 $\mu$j/cm² |
| 7 weeks | 160 $\mu$j/cm² |
| 28 weeks | 320 $\mu$j/cm². |

EXAMPLE 83

| | |
|---|---|
| 1,2-Diphenoxyethane | 0.852 g |
| 2-o-Chlorophenyl-4,5-di(m-methoxyphenyl)imidazole dimer | 0.024 g |
| 2-o-Chlorophenyl-4,5-diphenyl-imidazole dimer | 0.024 g |
| Michler's ketone | 0.010 g |
| 2-Mercaptobenzoxazole | 0.010 g |
| p-($\alpha$,$\alpha$-Dimethylbenzyl)phenyl methacrylate | 0.100 g |

The compositions required the following exposures after varying periods of storage to produce good printing plates.

| | |
|---|---|
| initial exposure | 80 $\mu$j/cm² |
| 7 weeks | 160 $\mu$j/cm² |
| 13 weeks | 320 $\mu$j/cm² |
| 21 weeks | 640 $\mu$j/cm² |

We claim:

1. A substantially dry, predominantly crystalline photoimageable composition in the form of a thin layer ranging from about 1 micron to about 1 millimeter in thickness, having substantially homogeneously distributed therethrough closely arrayed crystals consisting essentially of at least one solid ethylenically unsaturated monomer melting in the range 25°to 100°C. and capable of forming a polymer having a degree of polymerization of at least 10 by free-radical initiated, chain propagating, addition polymerization, and for each part by weight of monomer, 0.001 to 1 part by weight of an organic, light-sensitive, free-radical generating system free of aliphatic halogen which initiates and subsequently does not terminate the polymerization, at least one component of which has an active light absorption band with a molar extinction coefficient of 100 or more measured in hexane in the range of 3300 to 8000 A, said composition having a crystallinity index of at least 0.2, being photopolymerizable in atmospheric oxygen and capable of yielding a photoimage on receiving light totalling 2000 μj./sq.cm. or less, said light being active to cause said free-radical generating system to generate free radicals.

2. A composition according to claim 1 in which the monomer is selected from the group consisting of N-phenyl-N-methyl acrylamide, pentaerythritol tetraacrylate, diacetone acrylamide, N-vinylsuccinimide, 4-acryloxybenzophenone, 1,4-bis(2-acryloxyethyl)benzene, and N-(2-acryloxyethyl)-succinimide.

3. A composition according to claim 1 in which the monomer is N-phenyl-N-methyl acrylamide.

4. A composition according to claim 1 in which the monomer is diacetone acrylamide.

5. A composition according to claim 1 in which the monomer is N-vinylsuccinimide.

6. A composition according to claim 1 in which the monomer is 1,4-bis(2-acryloxyethyl)benzene.

7. A composition according to claim 1 wherein the monomer is acidic or basic and there is included a dye which is complementarily basic or acidic.

8. A composition according to claim 1 in which the free-radical generating system is selected from the group consisting of benzoin methyl ether, benzoin ethyl ether, benzoin phenyl ether, alpha methyl benzoin, alpha methyl benzoin methyl ether, benzophenone, 4,-4'-bis(dimethylamino)benzophenone, 4,4'-bis(diethylamino)benzophenone, 4-hydroxy-4'-dimethylamino benzophenone, 4-hydroxy-4'-diethylamino benzophenone, 4-acryloxy-4'-dimethylamino benzophenone, 4-acryloxy-4'-diethylamino benzophenone, 4-methoxy-4'-dimethylamino benzophenone, 2,4,5-triarylimidazole dimers and biacetyl.

9. A composition according to claim 1 wherein the free-radical generating system is a benzoin ether.

10. A composition according to claim 1 wherein the free-radical generating system is methyl benzoin ether.

11. A composition according to claim 1 wherein the free-radical generating system is ethyl benzoin ether.

12. A composition according to claim 1 wherein the free-radical generating system is phenyl benzoin ether.

13. A composition according to claim 1 wherein the free-radical generating system is alpha methyl benzoin.

14. A composition according to claim 1 wherein the free-radical generating system is 4,4'-bis(dimethylamino)benzophenone.

15. A composition according to claim 1 wherein the free-radical generating system is 4,4'-bis(diethylamino)benzophenone.

16. A composition according to claim 1 wherein the free-radical generating system is a 2,4,5-triarylimidazole dimer and 2-mercaptobenzoxazole.

17. A composition according to claim 1 wherein the free-radical generating system is a 2,4,5-triarylimidazole dimer and 4,4'-bis(dimethylamino)-benzophenone.

18. A composition according to claim 1 wherein the free-radical generating system is 2-mercaptobenzoxazole and 2-o-chlorophenyl-4,5-di(m-methoxyphenyl)imidazole dimer.

19. A composition according to claim 1 comprising N-vinylsuccinimide, 2-mercaptobenzoxazole and 2-o-chlorophenyl-4,5-di(m-methoxyphenyl)imidazole dimer.

20. A substantially dry, predominently crystalline photoimageable composition in the form of a thin layer ranging from about 1 micron to about 1 millimeter in thickness, having substantially homogeneously distributed therethrough closely arrayed crystals consisting essentially of at least one solid ethylenically unsaturated monomer melting about 25°C. and capable of forming a polymer having a degree of polymerization of at least 10 by free-radical initiated, chain propagating, addition polymerization, and for each part by weight of monomer, 0.001 to 1 part by weight of an organic, light-sensitive, free-radical generating system free of aliphatic halogen which initiates and subsequently does not terminate the polymerization, at least one component of which has an active light absorption band with a molar extinction coefficient of 100 or more measured in hexane in the range of 3300 to 8000 A, and for each part by weight of monomer, 0.01 to 0.25 parts by weight of a nonpolymeric normally liquid organic compound which does not inhibit the polymerization of the monomer and does not absorb so much of the active incident light as to prevent the initiation of the polymerization by the free-radical generating system, said composition having a crystallinity index of at least 0.2, being photopolymerizable in atmospheric oxygen and capable of yielding a photoimage on receiving light totalling 2000 μj./sq.cm. or less, said light being active to cause said free-radical generating system to generate free radicals.

21. A composition according to claim 20 wherein at least one monomer is acidic or basic and there is included a dye which is complementarily basic or acidic.

22. A composition according to claim 20 comprising N-vinylsuccinimide, 2-mercaptobenzoxazole, 2-o-chlorophenyl-4,5-di(m-methoxyphenyl)imidazole dimer and hexamethylene diacrylate.

23. A substantially dry, predominantly crystalline photoimageable composition in the form of a thin layer ranging from about 1 micron to about 1 millimeter in thickness, having substantially homogeneously distributed therethrough closely arrayed crystals consisting essentially of at least one nongaseous ethylenically unsaturated monomer capable of forming a polymer having a degree of polymerization of at least 10 by free-radical initiated, chain propagating, addition polymerization, and for each part by weight of monomer, 0.001 to 5 parts by weight of an organic, light-sensitive, free-radical generating system free of aliphatic halogen which initiates and subsequently does not terminate the polymerization, at least one component of which has an active light absorption band with a molar extinction coefficient of 100 or more measured in hexane in the range of 3300 to 8000 A, and for each part by weight of monomer, 0.01 to 250 parts by weight of a nonpolymerizable crystalline organic solid which melts in the range 25°–200°C., does not inhibit the polymerization of the monomer, and does not absorb so much of the active incident light as to prevent the initiation of the polymerization by the free-radical generating system, with the proviso that the free-radical generating system does not exceed 50% by weight of the combined weight of monomer, free-radical generating system and crystalline solid, said composition having a crystallinity index of at least 0.2 and capable of yielding a photoimage on receiving light totalling 2000 μj./sq.cm. or less, said light being active to cause said free-radical generating system to generate free radicals.

24. A composition according to claim 23 wherein the composition is photopolymerizable in air and the monomer is a liquid.

25. A composition according to claim 23 wherein the composition is photopolymerizable in an inert atmosphere and the monomer is a liquid.

26. A composition according to claim 23 wherein the crystalline solid is selected from the group consisting of bibenzyl, biphenyl, pentamethylbenzene, p-diethoxybenzene, diphenoxyethane, cyclododecanol, 1,12-dodecanediol and octacosane.

27. A composition according to claim 23 wherein the crystalline solid is 1,2-diphenoxyethane.

28. A composition according to claim 23 wherein the crystalline solid is biphenyl.

29. A composition according to claim 23 wherein the crystalline solid is 1,2-diphenoxyethane and the monomer is selected from the group consisting of pentaerythritol triacrylate, N-(2-acryloxyethyl)succinimide, pentaerythritol tetraacrylate, 1,4-bis(2-acryloxyethyl)-benzene and 4-acryloxybenzophenone.

30. A composition according to claim 23 wherein the crystalline solid is p-diethoxybenzene.

31. A composition according to claim 23 wherein the crystalline solid is cyclododecanol and the monomer is pentaerythritol triacrylate.

32. A composition according to claim 23 wherein the crystalline solid is octacosane and the monomer is pentaerythritol triacrylate.

33. A composition according to claim 23 comprising ethylene diacrylate, 4-acryloxy-4'-diethylaminobenzophenone, 2-mercaptobenzoxazole, 2-o-chlorophenyl-4,5-di(m-methoxyphenyl)imidazole dimer, 4,4'-bis(diethylamino)benzophenone, and cyclododecanol.

34. A composition according to claim 23 comprising 1,2-diphenoxyethane, 2-o-chlorophenyl-4,5-di(m-methoxyphenyl)imidazole dimer, 2-mercaptobenzoxazole, 2,5-bis(p-diethylaminobenzylidene)cyclopentanone, 4-acryloxy-4'-diethylaminobenzophenone.

35. A composition according to claim 23 comprising 1,2-diphenoxyethane, 2-o-chlorophenyl-4,5-di(m-methoxyphenyl)imidazole dimer, 2-mercaptobenzoxazole, Michler's ketone, and 3-acryloxybenzophenone.

36. A composition according to claim 23 comprising 1,2-diphenoxyethane, 2-o-chlorophenyl-4,5-di(m-methoxyphenyl)imidazole dimer, 2-mercaptobenzoxazole, 3-acryloxybenzophenone, and 4-dimethylamino-4'-(N-n-propyl-N-isoamylamino)benzophenone.

37. A composition according to claim 23 comprising 1,2-diphenoxyethane, 2-o-chlorophenyl-4,5-di(m-methoxyphenyl)imidazole dimer, 2-mercaptobenzoxazole, and 1,4-bis(2-acryloxyethyl)benzene.

38. A composition according to claim 23 comprising 1,2-diphenoxyethane, 2-o-chlorophenyl-4,5-di(m-methoxyphenyl)-imidazole dimer, 2-mercaptobenzoxazole, 4-dimethylamino-4'-(N-n-propyl-N-isoamylamino)benzophenone, and 1,4-bis(2-acryloxyethyl)benzene.

39. A composition according to claim 23 comprising 1,2-diphenoxyethane, 2-o-chlorophenyl-4,5-di(m-methoxyphenyl)-imidazole dimer, 2-mercaptobenzoxazole, Michler's ketone, 2-o-chlorophenyl-4,5-diphenylimidazole dimer, and 3-acryloxybenzophenone.

40. A composition according to claim 23 comprising 1,2-diphenoxyethane, 2-o-chlorophenyl-4,5-di(m-methoxyphenyl)-imidazole dimer, 2-mercaptobenzoxazole, Michler's ketone, 2-o-chlorophenyl-4,5-diphenylimidazole dimer, and 4-acryloxybenzophenone.

41. A composition according to claim 23 comprising 1,2-diphenoxyethane, 2-o-chlorophenyl-4,5-di(m-methoxyphenyl)-imidazole dimer, 2-mercaptobenzoxazole, Michler's ketone, and 2,4-diacryloxybenzophenone.

42. A composition according to claim 23 comprising 1,2-diphenoxyethane, 2-o-chlorophenyl-4,5-di(m-methoxyphenyl)-imidazole dimer, 2-mercaptobenzoxazole, Michler's ketone, and N-(2-acryloxypropyl)succinimide.

43. A composition according to claim 23 comprising 1,2-diphenoxyethane, 2-o-chlorophenyl-4,5-di(m-methoxyphenyl)-imidazole dimer, 2-o-chlorophenyl-4,5-diphenylimidazole dimer, 2-mercaptobenzoxazole, and 4-acryloxydiphenylmethane.

44. A composition according to claim 23 comprising 1,2-diphenoxyethane, 2-o-chlorophenyl-4,5-(di-m-methoxyphenyl)-imidazole dimer, 2-o-chlorophenyl-4,5-diphenylimidazole dimer, 4,4'-bis(dimethylamino)benzophenone, 2-mercaptobenzoxazole, N-(2-acryloxy-n-propyl)succinimide, and 2-phenyl-2-(p-acryloxyphenyl)propane.

45. A composition according to claim 23 wherein a. the unsaturated monomer has the formula

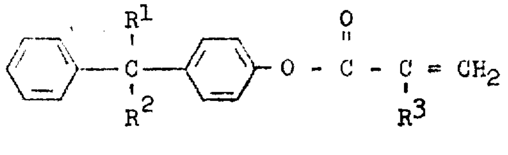

in which $R^1$ and $R^2$, alike or different, are alkyl of up to 4 carbons;

$R^3$ is hydrogen or methyl;

b. the free radical generating system comprises 1. 2,4,5-triarylimidazole dimer,
2. Michler's ketone, and
3. 2-mercaptobenzoxazole.

46. A composition according to claim 45 containing 2-(o-chlorophenyl)-4,5-di(m-methoxyphenyl)imidazole dimer and 2-(o-chlorophenyl)-4,5-diphenylimidazole dimer.

47. A composition according to claim 46 containing 1,2-diphenoxyethane.

48. A composition according to claim 47 containing p(α,α-dimethylbenzyl)phenyl acrylate.

49. A composition according to claim 47 containing p-(α,α-dimethylbenzyl)phenyl methacrylate.

50. A composition according to claim 23 wherein the monomer is acidic or basic and there is included a dye which is complementarily basic or acidic.

51. A composition according to claim 50 comprising 6-acrylamidocaproic acid, benzoin methyl ether and crystal violet dye.

52. The process of photopolymerization comprising exposing a crystalline composition of claim 1 to light having a wavelength of 2000 to 8000 A.

53. The process of photopolymerization comprising exposing a crystalline composition of claim 20 to light having a wavelength of 2000 to 8000 A.

54. The process of photopolymerization comprising exposing a crystalline composition of claim 23 to light having a wavelength of 2000 to 8000 A.

55. The process of photopolymerization comprising exposing a crystalline composition of claim 1 to light having a wavelength of 2000 to 8000 A to form an image and then developing the image by volatilizing unreacted components.

56. The process of photopolymerization comprising exposing a crystalline composition of claim 20 to light having a wavelength of 2000 to 8000 A to form an image and then developing the image by volatilizing unreacted components.

57. The process of photopolymerization comprising exposing a crystalline composition of claim 23 to light having a wavelength of 2000 to 8000 A to form an image and then developing the image by volatilizing unreacted components.

58. The process of photopolymerization comprising exposing a crystalline composition of claim 7 to light having a wavelength of 2000 to 8000 A.

59. The process of photopolymerization comprising exposing a crystalline composition of claim 21 to light having a wavelength of 2000 to 8000 A.

60. The process of photopolymerization comprising exposing a crystalline composition of claim 50 to light having a wavelength of 2000 to 8000 A.

61. A composition according to claim 1 on a support.

62. A composition according to claim 1 on a support comprising a conductive metal layer.

63. A composition according to claim 1 on a support comprising a conductive metal layer one surface of which is in contact with a coextensive surface of an insulating layer.

64. A composition according to claim 20 on a support.

65. A composition according to claim 20 on a support comprising a conductive metal layer.

66. A composition according to claim 20 on a support comprising a conductive metal layer one surface of which is in close contact with a coextensive surface of an insulating layer.

67. A composition according to claim 23 on a support.

68. A composition according to claim 23 on a support comprising a conductive metal layer.

69. A composition according to claim 23 on a support comprising a conductive metal layer one surface of which is in close contact with a coextensive surface of an insulating layer.

70. An assembly comprising a support sheet, a layer of a crystalline composition according to claim 1 one surface of which is adhered to the support sheet, and a transparent sheet adhered to the other surface of the crystalline layer, the said crystalline layer having better adhesion to the support sheet than to the transparent sheet.

71. An assembly comprising a support sheet, a layer of a crystalline composition according to claim 20 one surface of which is adhered to the support sheet, and a transparent sheet adhered to the other surface of the crystalline layer, the said crystalline layer having better adhesion to the support sheet than to the transparent sheet.

72. An assembly comprising a support sheet, a layer of a crystalline composition according to claim 23 one surface of which is adhered to the support sheet, and a transparent sheet adhered to the other surface of the crystalline layer, the said crystalline layer having better adhesion to the support sheet than to the transparent sheet.

73. A composition according to claim 70 wherein the crystalline layer contains pigment particles.

74. A composition according to claim 71 wherein the crystalline layer contains pigment particles.

75. A composition according to claim 72 wherein the crystalline layer contains pigment particles.

76. The process of adhesion comprising placing a crystalline composition of claim 1 in contacting relationship with two substrates and exposing the said crystalline composition to light having a wavelength of 2000 to 8000 A.

77. A composition according to claim 1 capable of yielding a photoimage on receiving light totalling 1000 μj./sq.cm. or less.

78. A composition according to claim 20 capable of yielding a photoimage on receiving light totalling 1000 μj./sq.cm. or less.

79. A composition according to claim 23 capable of yielding a photoimage on receiving light totalling 1000 μj./sq.cm. or less.

* * * * *